(12) United States Patent
Matsuura

(10) Patent No.: US 11,323,648 B2
(45) Date of Patent: May 3, 2022

(54) SOLID-STATE IMAGE SENSOR AND ELECTRONIC APPARATUS

(71) Applicant: Sony Semiconductor Solutions Corporation, Kanagawa (JP)

(72) Inventor: Kouji Matsuura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/646,031

(22) PCT Filed: Sep. 5, 2018

(86) PCT No.: PCT/JP2018/032824
§ 371 (c)(1),
(2) Date: Mar. 10, 2020

(87) PCT Pub. No.: WO2019/069614
PCT Pub. Date: Apr. 11, 2019

(65) Prior Publication Data
US 2020/0265909 A1    Aug. 20, 2020

(30) Foreign Application Priority Data
Oct. 3, 2017 (JP) .............................. JP2017-193441

(51) Int. Cl.
*H04N 5/378* (2011.01)
*H04N 5/357* (2011.01)
*H04N 5/369* (2011.01)

(52) U.S. Cl.
CPC ........... *H04N 5/378* (2013.01); *H04N 5/3575* (2013.01); *H04N 5/379* (2018.08)

(58) Field of Classification Search
CPC ....... H04N 5/3575; H04N 5/378; H04N 5/379
See application file for complete search history.

(56) References Cited

U.S. PATENT DOCUMENTS

| 2005/0040318 A1* | 2/2005 | Ooshima | ............... | H04N 5/3575 250/208.1 |
| 2014/0139713 A1* | 5/2014 | Gomi | ..................... | H04N 5/379 348/308 |
| 2015/0229859 A1* | 8/2015 | Guidash | ................. | H04N 5/378 348/308 |

FOREIGN PATENT DOCUMENTS

| JP | 2008-219293 A | 9/2008 |
| JP | 2010-034616 A | 2/2010 |
| JP | 2017-118196 A | 6/2017 |
| WO | 2017/056248 A1 | 4/2017 |

* cited by examiner

*Primary Examiner* — Daniel M Pasiewicz
(74) *Attorney, Agent, or Firm* — Michael Best & Friedrich LLP

(57) ABSTRACT

The present invention relates to a solid-state image sensor including a pixel array section including a plurality of unit pixels each having a photoelectric conversion unit, the plurality of unit pixels being arranged in a matrix, a sample-and-hold unit configured to sample and hold a pixel signal output from the unit pixel through a vertical signal line provided in association with column arrangement of the pixel array section, and an analog-to-digital conversion unit configured to convert a pixel signal output from the sample-and-hold unit into a digital signal. Then, the sample-and-hold unit has two sample-and-hold circuits in parallel for one vertical signal line, and at least one of the two sample-and-hold circuits has at least two sampling capacitors.

20 Claims, 16 Drawing Sheets

TO SAMPLE-AND-HOLD UNIT

SOLID-STATE IMAGE SENSOR AND ELECTRONIC APPARATUS

TECHNICAL FIELD

The present disclosure relates to a solid-state image sensor and an electronic apparatus.

BACKGROUND ART

In a solid-state image sensor, a readout circuit including an analog-to-digital converter or the like is necessary to be operated at an extended input voltage range caused by variation in reset levels of a unit pixel, fluctuation due to dark current, an increase in saturation signal amount, or the like. Then, an analog circuit for being operable at a wide input voltage range thus typically necessitates a high power supply voltage. However, the high power supply voltage unfortunately increases the power consumption accordingly, and thus it is desirably necessary to be operable at a wide input voltage range without an increase in the power supply voltage.

In related art, Japanese Patent Application Laid-Open No. 2008-219293 discloses a technique that addresses such a problem, for example, limitation on an input voltage range due to dark current. Japanese Patent Application Laid-Open No. 2008-219293 discloses the technique in which a feedback control unit for outputting an offset compensation signal used to compensate an error amount between an output signal of a light-shielded pixel region and a reference value in common to each input side of a plurality of analog-to-digital converters is provided, thereby widening the input voltage range by subtracting the offset compensation signal from the output signal of the effective pixel region.

CITATION LIST

Patent Document

Patent Document 1: Japanese Patent Application Laid-Open No. 2008-219293

SUMMARY OF THE INVENTION

Problems to be Solved by the Invention

The related art disclosed in the Japanese Patent Application Laid-Open No. 2008-219293 mentioned above is necessary to be provided with an additional circuit, that is, a feedback control unit for widening the input voltage range to the outside of the readout circuit. Thus, there are concerns of an increase in circuit scale due to installation of the additional circuit, deterioration of noise characteristics due to the additional circuit, or the like.

In view of this, the present disclosure provides a solid-state image sensor operable at a wide input voltage range without installing an additional circuit to the outside of the readout circuit or setting a power supply voltage to high level, and provides an electronic apparatus including such solid-state image sensor.

Solutions to Problems

In order to achieve the issue above, a solid-state image sensor according to the present disclosure includes:

a pixel array section including a plurality of unit pixels each having a photoelectric conversion unit, the plurality of unit pixels being arranged in a matrix;

a sample-and-hold unit configured to sample and hold a pixel signal output from the unit pixel through a vertical signal line provided in association with column arrangement of the pixel array section; and an analog-to-digital conversion unit configured to convert a pixel signal output from the sample-and-hold unit into a digital signal, in which the sample-and-hold unit has two sample-and-hold circuits in parallel for one vertical signal line, and at least one of the two sample-and-hold circuits has at least two sampling capacitors.

Furthermore, an electronic apparatus according to an embodiment of the present disclosure for achieving the above object includes the solid-state image sensor having the configuration described above.

Effects of the Invention

According to the present disclosure, it is possible to be operable at a wide input voltage range without installing an additional circuit to the outside of the readout circuit or setting the power supply voltage to high level.

Note that the effect described here is not a limitation necessarily, but one of the effects described in the present specification may be achieved. Also, the effect described in the present specification is just an example and is not limited thereto, and an additional effect may be enabled.

MODE FOR CARRYING OUT THE INVENTION

Figure 1:
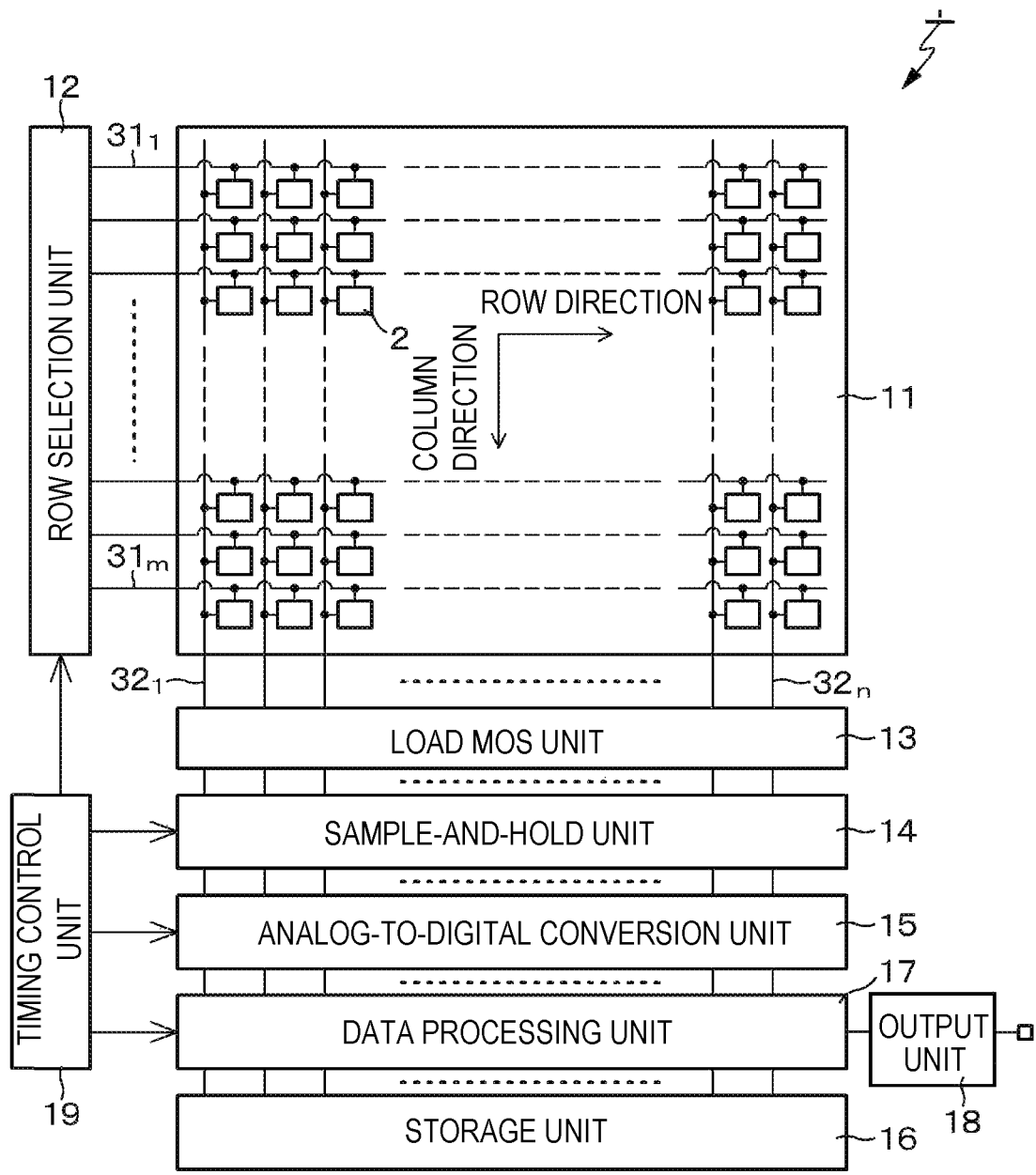
FIG. 1 is a block diagram illustrating schematic basic configuration of a CMOS image sensor as one example of a solid-state image sensor according to the present disclosure.

In the following, a mode for carrying out the technology according to the present disclosure (hereinafter, referred to as "embodiment") will be described in detail by using drawings. The technology according to the present disclosure is not limited to the embodiment, and various numerical values in embodiments are examples. In the below description, the same reference signs are used for the same elements or the elements having the same function, and repetitive description is omitted. Note that description will be made in the following order.

1. Overall description of solid-state image sensor and electronic apparatus of present disclosure
2. Solid-state image sensor of present disclosure
2-1. Basic configuration
2-2. Circuit configuration of unit pixel
2-3. Stacked structure
2-4. Expansion of input voltage range
2-5. Sample-and-hold unit according to embodiments
2-5-1. First example (example having two sampling capacitors)
2-5-2. Second example (example where sampling capacitor includes combination of plurality of unit capacitors and single-slope analog-to-digital converter is used)
2-5-3. Third example (example where sampling capacitor includes combination of plurality of unit capacitors and delta-sigma analog-to-digital converter is used)
2-6. Modification of embodiments
2-7. Application example of embodiments
3. Applied example of technology according to present disclosure
3-1. Electronic apparatus of present disclosure (example of image-capturing device)
3-2. Application example of moving object
4. Configuration achievable by employing present disclosure Overall Description of Solid-State Image Sensor and Electronic Apparatus of Present Disclosure The solid-state image sensor and the electronic apparatus according to the present disclosure are capable of including the configuration having a stacked structure in which at least two semiconductor substrates of a first semiconductor substrate and a second semiconductor substrate are arranged on top of each other. In addition, in this stacked structure, a pixel array section is preferably formed on the first semiconductor substrate, and the sample-and-hold unit is preferably formed on a semiconductor substrate other than the first semiconductor substrate.

In the solid-state image sensor and the electronic apparatus of the present disclosure including the above-described preferable configuration, at least one of two sample-and-hold circuits is capable of being provided with a first switch unit that selectively short-circuits between input ends of sampling capacitors. In addition, each of at least two sampling capacitors is capable of including combination of a plurality of unit capacitors.

Furthermore, in the solid-state image sensor and the electronic apparatus of the present disclosure including the above-described preferable configuration, at least one of the two sample-and-hold circuits is capable of being provided with a second switch unit including a group of switches that selectively short-circuit between a vertical signal line and each input end of a plurality of unit capacitors by using an independent control signal. In addition, the first switch unit is capable of including a group of switches that selectively short-circuit between input ends of unit capacitors adjacent to each other.

Furthermore, in the solid-state image sensor and the electronic apparatus of the present disclosure including the above-described preferable configuration, a pixel signal is capable of including a reset signal output from a unit pixel upon resetting and a data signal output from the unit pixel during photoelectric conversion. In addition, one of the two sample-and-hold circuits is capable of including a sampling capacitor for sampling the reset signal and a sampling capacitor for sampling the data signal.

Furthermore, the solid-state image sensor and the electronic apparatus of the present disclosure including the above-described preferable configuration is capable of controlling the capacitor ratio between the sampling capacitor for sampling the reset signal and the sampling capacitor for sampling the data signal by switching each switch in the switch group of the second switch unit. In addition, the two sample-and-hold circuits are capable of having the same circuit configuration.

Furthermore, in the solid-state image sensor and the electronic apparatus of the present disclosure including the above-described preferable configuration, an analog-to-digital conversion unit is capable of including a single-slope analog-to-digital converter or a delta-sigma analog-to-digital converter.

Solid-State Image Sensor of Present Disclosure

Basic Configuration

The basic configuration of the solid-state image sensor according to the present disclosure is first described. The present embodiment is described as a solid-state image sensor by exemplifying a complementary metal-oxide semiconductor (CMOS) image sensor that is one type of solid-state image sensors employing an X-Y address method. The CMOS image sensor is an image sensor fabricated by applying or partially using the CMOS process.

FIG. 1 is a block diagram illustrating schematic basic configuration of the CMOS image sensor as one example of the solid-state image sensor of the present disclosure. The CMOS image sensor 1 according to this example includes a pixel array section 11 in which a unit pixel 2 (hereinafter, sometimes simply referred to as "pixel") having a photoelectric conversion unit and a peripheral circuit section in the vicinity of the pixel array section 11. Here, the unit pixels are two-dimensionally arranged in a row direction and a column direction, that is, in a matrix. In this description, the row direction refers to the direction of the unit pixels 2 arranged in the pixel row (what is called, horizontal direction), and the column direction refers to the direction of the unit pixels 2 arranged in the pixel column (what is called, vertical direction). The unit pixel 2 performs photoelectric conversion to generate and accumulate photoelectric charge corresponding to quantity of the received light.

The peripheral circuit section in the vicinity of the pixel array section 11 includes, in one example, a row selection unit 12, a load MOS unit 13, a sample-and-hold unit 14, an analog-to-digital conversion unit 15, a storage unit 16, a data processing unit 17, an output unit 18, and a timing control unit 19, or the like.

The pixel array section 11 has the matrix pixel arrangement including a pixel drive line 31 and a vertical signal line 32. The pixel drive lines 31 ($31_1$-$31_m$) are wired along the row direction for each pixel row, and the vertical signal lines 32 ($32_1$-$32_n$) are wired along the column direction for each pixel column. The pixel drive line 31 transmits, upon reading out a signal from the unit pixel 2, a drive signal used to drive it. The pixel drive line 31 is illustrated as one wiring in FIG. 1, but it's number is not limited to one. One end of the pixel drive line 31 is connected to an output end associated with each row of the row selection unit 12.

The description of each circuit unit of the peripheral circuit section in the vicinity of the pixel array section 11, that is, the row selection unit 12, the load MOS unit 13, the sample-and-hold unit 14, the analog-to-digital conversion unit 15, the storage unit 16, the data processing unit 17, the output unit 18, and the timing control unit 19 is now given.

The row selection unit 12 includes a shift register, an address decoder, or the like, and drives each pixel 2 of the pixel array section 11 at the same time for all pixels or in units of rows. In other words, the row selection unit 12 and the timing control unit 19 that controls the row selection unit 12 constitute a drive unit that drives each pixel 2 of the pixel array section 11. Although the specific configuration of the row selection unit 12 is not illustrated, the row selection unit 12 typically includes two scanning systems, a readout scanning system and a sweeping scanning system.

The readout scanning system selectively scans the unit pixels 2 of the pixel array section 11 sequentially in units of rows to read out pixel signals from the unit pixels 2. The pixel signal read from the unit pixel 2 is an analog signal. The sweeping scanning system performs sweeping scanning with respect to the readout row on which the readout scanning is performed by the readout scanning system prior to the readout scanning by the time corresponding to the shutter speed.

The sweeping scanning by the sweeping scanning system sweeps out unnecessary electric charge from the photoelectric conversion unit of the unit pixel 2 in the readout row, thereby resetting the photoelectric conversion unit. Thus, this sweeping (resetting) of unnecessary electric charge by the sweeping scanning system enables, what is called, electronic shutter operation to be performed. In this description, the electronic shutter operation refers to an operation for sweeping out photoelectric charge of the photoelectric conversion unit and starting new exposure (starting accumulation of photoelectric charge).

The signal read out by the readout scanning system performing the readout operation corresponds to the amount of light received subsequent to the immediately preceding readout operation or the electronic shutter operation. Then, the period from the readout timing at the immediately preceding readout operation or the sweeping timing at the electronic shutter operation to the readout timing at the current read operation is the photoelectric charge exposure period in the unit pixel 2.

The load MOS unit 13 includes a set of current sources I having a MOS transistor connected to each of the vertical signal lines 32 ($32_1$-$32_n$) for each pixel column (see FIG. 2), and supplies a bias current to each pixel 2 in the pixel row selectively scanned by the row selection unit 12 via each vertical signal line 32.

The sample-and-hold unit 14 samples and holds (sample-and-hold operation) pixel signals supplied via the vertical signal lines 32 ($32_1$-$32_n$). The technology according to the present disclosure is applied to the sample-and-hold unit 14. The sample-and-hold unit 14 to which the technology according to the present disclosure is applied has two sample-and-hold circuits in parallel with respect to one vertical signal line 32. In addition, at least one of the two sample-and-hold circuits has at least two sampling capacitors. Detailed description of the sample-and-hold unit 14 will be given later.

The analog-to-digital (A/D) conversion unit 15 includes a set of a plurality of analog-to-digital converters provided in association with the vertical signal lines 32 ($32_1$-$32_n$), and converts an analog pixel signal output from the sample-and-hold unit 14 for each pixel column into a digital signal. The analog-to-digital converter is capable of employing a well-known analog-to-digital converter. Specifically, the analog-to-digital converter is capable of employing, as one example, a single-slope analog-to-digital converter, a successive approximation analog-to-digital converter, or a delta-sigma ($\Delta\Sigma$) analog-to-digital converter. However, the analog-to-digital converter is not limited to these examples.

The storage unit 16 stores an analog-to-digital conversion result of the analog-to-digital conversion unit 15 through processing in the data processing unit 17.

The data processing unit 17 is a digital signal processing unit that processes a digital signal output from the analog-to-digital conversion unit 15. The data processing unit 17 performs processing of writing or reading an analog-to-digital conversion result to or from the storage unit 16, or performs various types of processing on the analog-digital conversion result.

The output unit 18 outputs a signal processed in the data processing unit 17. The timing control unit 19 generates various types of timing signals, clock signals, control signals, or the like, and performs drive control on the row selection unit 12, the sample-and-hold unit 14, the analog-to-digital conversion unit 15, the data processing unit 17, or the like on the basis of these generated signals.

Circuit Configuration of Unit Pixel

Figure 2:
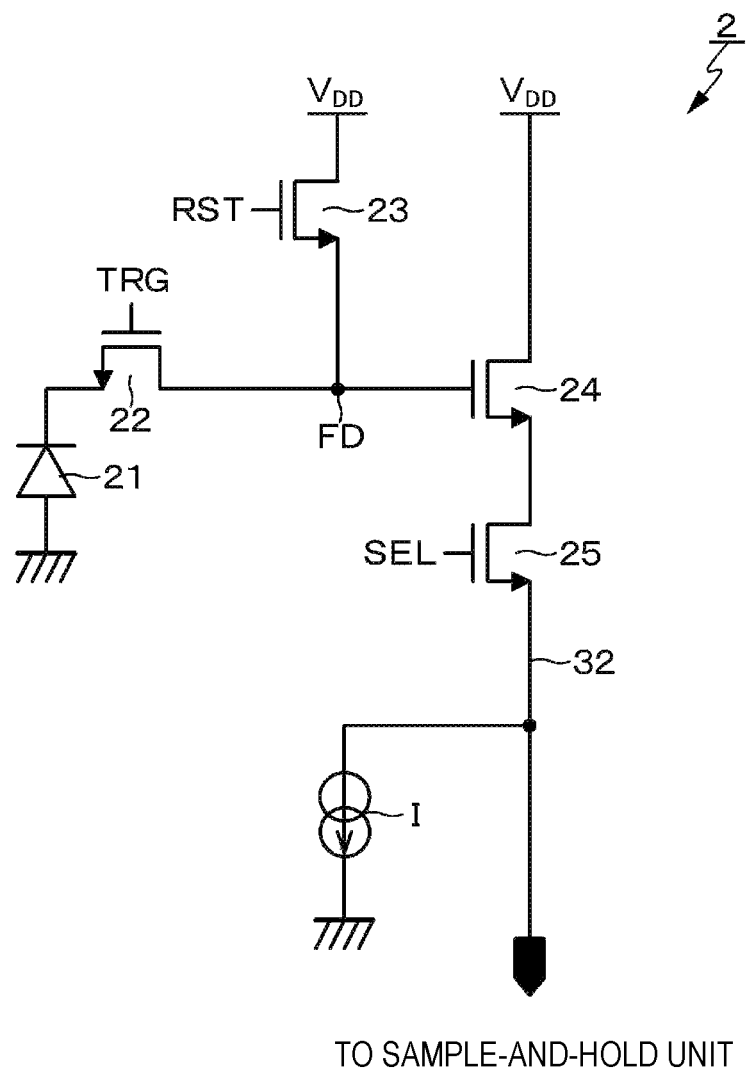
FIG. 2 is a circuit diagram illustrating one example of circuit configuration in a unit pixel.

FIG. 2 is a circuit diagram illustrating one example of circuit configuration in the unit pixel 2. The unit pixel 2 includes, in one example, a photodiode 21 as a photoelectric conversion unit. The unit pixel 2 has pixel configuration including, in addition to the photodiode 21, a transfer transistor 22, a reset transistor 23, an amplification transistor 24, and a selection transistor 25.

Moreover, in this description, four transistors of the transfer transistor 22, the reset transistor 23, the amplification transistor 24, and the selection transistor 25 employ, in one example, an N-channel MOSFET. However, the combination of conductivity types of these four transistors 22 to 25 illustrated in this example is merely an example, and is not limited to such combination.

In this unit pixel 2, a plurality of pixel drive lines used as the pixel drive lines 31 ($31_1$-$31_m$) described above is wired in common to the respective pixels 2 in the same pixel row. These plurality of pixel drive lines is connected to the output ends corresponding to each pixel row of the row selection unit 12 in units of pixel rows. The row selection unit 12 outputs a transfer signal TRG, a reset signal RST, and a selection signal SEL appropriately to the plurality of pixel drive lines.

The photodiode 21 has an anode electrode connected to a low-potential-side power supply (e.g., ground). The photodiode 21 performs photoelectrical conversion on the received light into photoelectric charge (in this example, photoelectrons) of a charge amount corresponding to the light amount, and accumulates the photoelectric charge. The cathode electrode of the photodiode 21 is electrically connected to a gate electrode of the amplification transistor 24 via the transfer transistor 22. In this description, the region where the gate electrode of the amplification transistor 24 is electrically connected is a floating diffusion (floating diffusion region or impurity diffusion region) FD. The floating diffusion FD is a charge-voltage conversion unit that converts electric charge into voltage.

The transfer signal TRG that is in an active state at high level (e.g., $V_{DD}$ level) is applied from the row selection unit 12 to a gate electrode of the transfer transistor 22. The transfer transistor 22 is made to the conduction state in response to the transfer signal TRG, thereby transferring the photoelectric charge, which obtained by photoelectrical conversion in the photodiode 21 and accumulated in the photodiode 21, to the floating diffusion FD.

The reset transistor 23 is connected between the node of a high-potential-side power supply $V_{DD}$ and the floating diffusion FD. The reset signal RST that is in an active state at high level is supplied from the row selection unit 12 to a gate electrode of the reset transistor 23. The reset transistor 23 is made to the conduction state in response to the reset signal RST, thereby resetting the floating diffusion FD by sweeping out electric charge of the floating diffusion FD to the node of the voltage $V_{DD}$.

The amplification transistor 24 has the gate electrode connected to the floating diffusion FD and a drain electrode connected to the node of the high-potential-side power supply $V_{DD}$. The amplification transistor 24 acts as an input port of a source follower that reads out a signal obtained by photoelectric conversion at the photodiode 21. In other words, the amplification transistor 24 has a source electrode connected to the vertical signal line 32 via the selection transistor 25. In addition, the amplification transistor 24 and the current source I connected to one end of the vertical signal line 32 constitute a source follower that converts the voltage of the floating diffusion FD into the potential of the vertical signal line 32.

The selection transistor 25 has, in one example, a drain electrode connected to the source electrode of the amplification transistor 24 and a source electrode connected to the vertical signal line 32. The selection signal SEL that is in an active state at high level is applied from the row selection unit 12 to a gate electrode of the selection transistor 25. The selection transistor 25 is made to the conduction state in response to the selection signal SEL, and so the state of the unit pixel 2 is made to the selected stat and the signal output from the amplification transistor 24 is transferred to the vertical signal line 32.

Moreover, the selection transistor 25 is capable of being configured as a circuit connected between the node of the high-potential-side power supply $V_{DD}$ and the drain electrode of the amplification transistor 24. In addition, this example exemplifies, as a pixel circuit of the unit pixel 2, the 4-Tr configuration including the transfer transistor 22, the reset transistor 23, the amplification transistor 24, and the selection transistor 25, that is, four transistors (Trs), but it is not limited to this example. In one example, the 3-Tr configuration in which the selection transistor 25 is omitted and the amplification transistor 24 has the function of the selection transistor 25 may be provided, or the configuration of 5-Tr or more in which the number of transistors is increased may be provided as necessary.

The unit pixel 2 having the above-described configuration sequentially outputs a reset signal that is a reset level at the time of resetting the floating diffusion FD by the reset transistor 23 (what is called P-phase signal) and a data signal that is a signal level based on photoelectric conversion in the photodiode 21 (what is called D-phase signal). In other words, the pixel signal output from the unit pixel 2 includes the reset signal upon resetting and the data signal upon performing photoelectric conversion.

Stacked Structure

Figure 3:
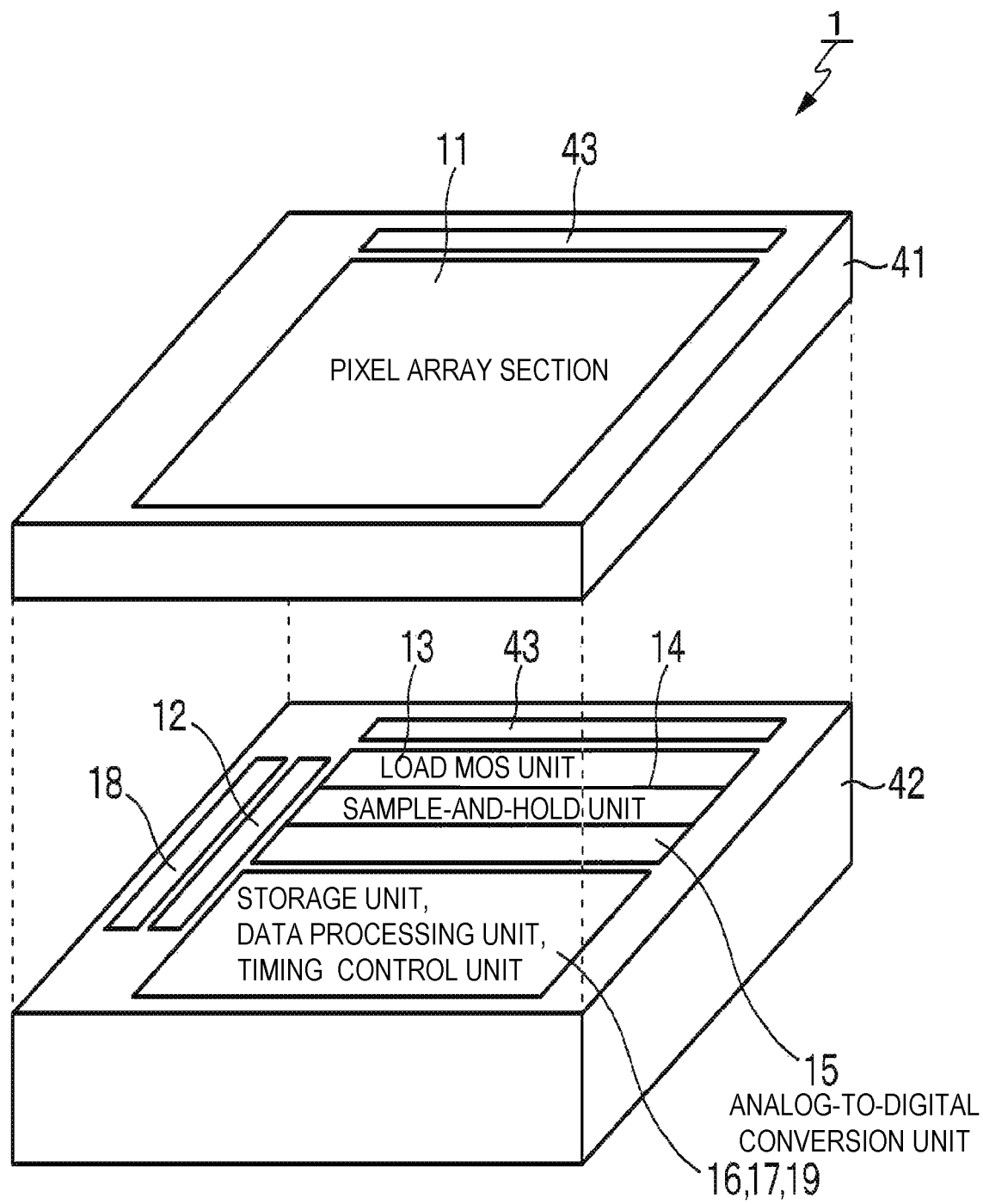
FIG. 3 is an exploded perspective view schematically illustrating a stacked structure of a CMOS image sensor.

The CMOS image sensor 1 having the above-described configuration is capable of employing, what is called, a stacked structure image sensor in which at least two semiconductor substrates (chips) of a first semiconductor substrate 41 and a second semiconductor substrate 42 are arranged on top of each other as illustrated in FIG. 3. In addition, the CMOS image sensor 1 according to the present example is capable of having a backside illumination pixel structure in which, assuming that the substrate side on which the wiring layer is disposed is the front surface (front side), the light emitted from the back side on the opposite side is captured.

In the CMOS image sensor 1 having the stacked structure, the pixel array section 11 in which the unit pixels 2 having a backside illumination pixel structure are arranged in a matrix is formed on the first semiconductor substrate 41 as a first layer. In addition, the circuitry components including the row selection unit 12, the load MOS unit 13, the sample-and-hold unit 14, the analog-to-digital conversion unit 15, the storage unit 16, the data processing unit 17, the output unit 18, the timing control unit 19, and the like are formed on the second semiconductor substrate 42 as a second layer. Then, the first semiconductor substrate 41 as the first layer and the second semiconductor substrate 42 as the second layer are electrically connected to each other through a via (VIA) 43.

The use of the CMOS image sensor 1 having this stacked structure enables the first semiconductor substrate 41 to have a size (area) sufficient only to dispose the pixel array section 11, thereby reducing the size (area) of the first semiconductor substrate 41 as the first layer and eventually the size of the entire chip. Furthermore, the process suitable for manufacturing the unit pixel 2 is applicable to the first semiconductor substrate 41 as the first layer, and the process suitable for manufacturing circuitry portions is applicable to the second semiconductor substrate 42 as the second layer, thereby providing an advantage that process optimization in manufacturing the CMOS image sensor 1 is achievable.

Moreover, this example illustrates a two-layer stacked structure in which the first semiconductor substrate 41 and the second semiconductor substrate 42 are arranged on top of each other, but the stacked structure is not limited to the two-layer structure, and a structure having three or more layers can be used. Then, in a case of employing a stacked structure of three or more layers, the circuitry portions including the row selection unit 12, the load MOS unit 13, the sample-and-hold unit 14, the analog-to-digital conversion unit 15, the storage unit 16, the data processing unit 17, the output unit 18, the timing control unit 19, or the like can be disposed in a distributed manner on the second and subsequent semiconductor substrates.

Further, the above example describes the case where the technology according to the present disclosure is applied to the stacked structure CMOS image sensor 1, but it is not limited to the application to the stacked structure CMOS image sensor 1. In other words, the technology according to the present disclosure is applicable to, what is called, a flat structure CMOS image sensor in which the circuitry portions including the row selection unit 12, the load MOS unit 13, the sample-and-hold unit 14, the analog-to-digital conversion unit 15, the storage unit 16, the data processing unit 17, the output unit 18, the timing control unit 19, or the like on the same semiconductor substrate as the pixel array section 11.

Expansion of Input Voltage Range

In the CMOS image sensor 1 having the above-described configuration, the readout circuit including the analog-to-digital conversion unit 15 or the like is necessary to be operated at an extended input voltage range caused by variation in reset levels of the unit pixels 2, fluctuation due to dark current, an increase in amounts of saturation signal, or the like. It is also desirable to be operable at a wide input voltage range without installing an additional circuit outside the readout circuit or setting a power supply voltage to high level.

Sample-and-Hold Unit According to Embodiments

Thus, in the present embodiment, the sample-and-hold unit 14 has the configuration in which two sample-and-hold circuits are provided in parallel with respect to one vertical signal line 32 and at least one of the two sample-and-hold circuits has at least two sampling capacitors. The use of this configuration makes it possible to be operated at a wide input voltage range without installing an additional circuit outside the readout circuit including the analog-to-digital conversion unit 15 or the like and without setting the power supply voltage to high level. Not installing an additional circuit outside the readout circuit prevents increase of the circuit scale due to installation of an additional circuit or deterioration of noise characteristics due to the additional circuit. In addition, it is unnecessary to set the power supply voltage to high level, thereby eliminating increase of power consumption.

The description of specific examples of the sample-and-hold unit 14 according to the present embodiment that is operable at a wide input voltage range without installing an additional circuit outside the readout circuit or setting a power supply voltage to high level is now given.

First Example

Figure 4:
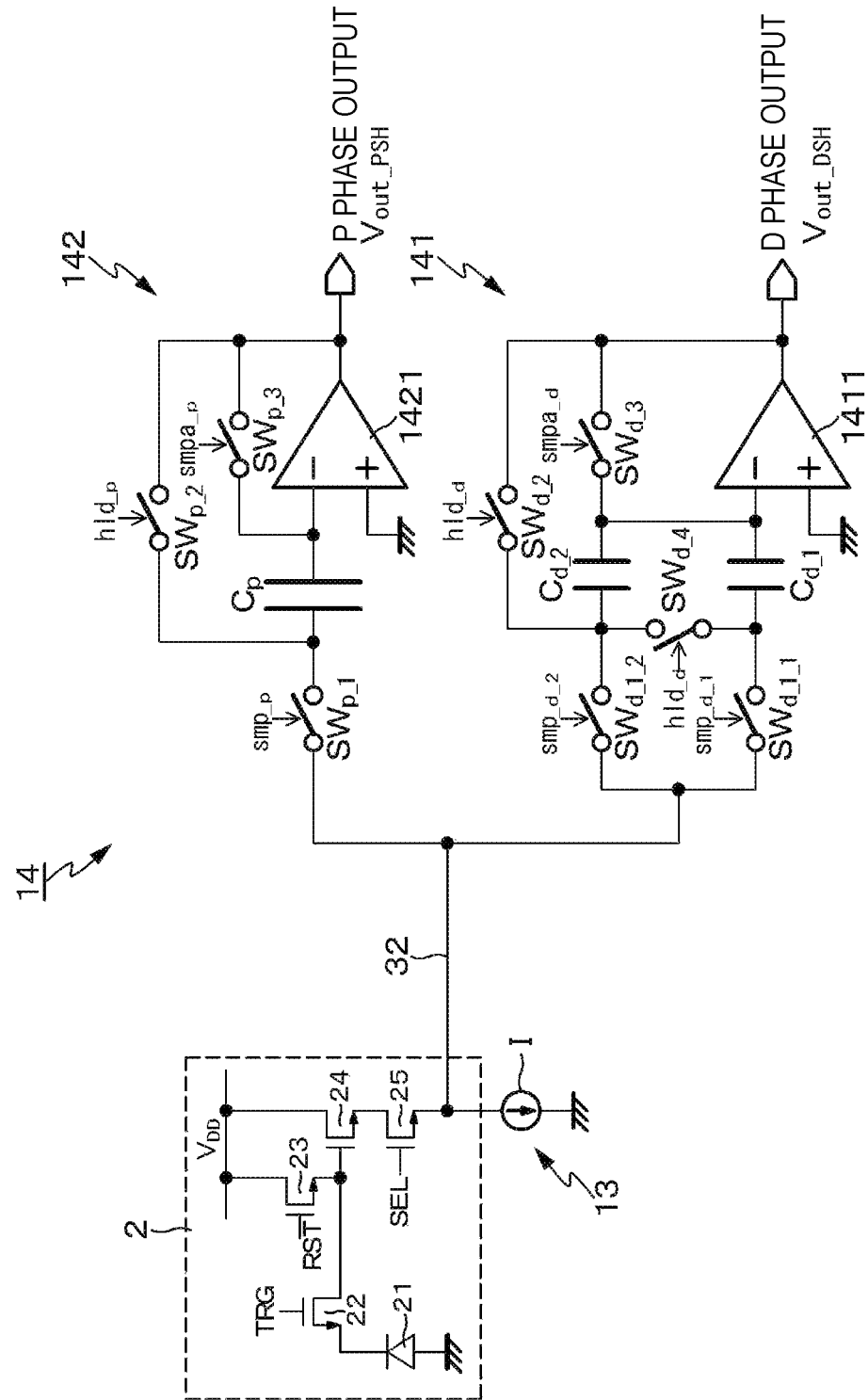
FIG. 4 is a circuit diagram illustrating circuit configuration of one-pixel column of a sample-and-hold unit according to a first example.

A first example is an example in which at least one of two sample-and-hold circuits has two sampling capacitors. FIG. 4 illustrates circuit configuration of one-pixel column of the sample-and-hold unit 14 according to the first example.

As illustrated in FIG. 4, the sample-and-hold unit 14 according to the first example has the configuration in which two sample-and-hold circuits 141 and 142 are arranged in parallel with respect to one vertical signal line 32. The one sample-and-hold circuit 141 is a data signal sample-and-hold circuit for a data signal (D-phase), and the other sample-and-hold circuit 142 is a reset signal sample-and-hold circuit for a reset signal (P-phase).

Data Signal Sample-and-Hold Circuit

The data signal sample-and-hold circuit 141 has an inverting amplifier 1411, two sampling capacitors $C_{d\_1}$ and $C_{d\_2}$, and five switch elements $SW_{d\_1\_1}$, $SW_{d\_1\_2}$, $SW_{d\_2}$, $SW_{d\_3}$, and $SW_{d\_4}$. The inverting amplifier 1411 has a non-inverting (+) input end that is grounded and has an output end that outputs a data signal sample-hold output $V_{out\_DSH}$.

The switch elements $SW_{d\_1\_1}$ and $SW_{d\_1\_2}$ have input ends connected to the vertical signal line 32 and output ends connected to the input ends (one end) of the sampling capacitors $C_{d\_1}$ and $C_{d\_2}$, and are turned on (closed) or off (open) by respective switch control signals $smp_{d\_1}$ and $smp_{d\_2}$. In other words, the switch elements $SW_{d\_1\_1}$ and $SW_{d\_1\_2}$ are configured as switch units (the second switch unit) that selectively short-circuit between the vertical signal line 32 and the input ends of the sampling capacitors $C_{d\_1}$ and $C_{d\_2}$ under the control of the independent switch control signals $smp_{d\_1}$ and $smp_{d\_2}$. The output ends (other end) of the switch elements $SW_{d\_1\_1}$ and $SW_{d\_1\_2}$ are connected in common to the inverting (−) input end of the inverting amplifier 1411.

A switch element $SW_{d\_2}$ is connected between the output end of the switch element $SW_{d\_1\_2}$ (the input end of the sampling capacitor $C_{d\_2}$) and the output end of the inverting amplifier 1411, and is turned on or off by a switch control signal $hld_d$. A switch element $SW_{d\_3}$ is connected between inverting input ends (the output ends of the sampling capacitors $C_{d\_1}$ and $C_{d\_2}$) of the inverting amplifier 1411 and the output end of the inverting amplifier 1411, and is turned on or off by a switch control signal $smpa_d$.

A switch element $SW_{d\_4}$ is connected between the input end of the sampling capacitor $C_{d\_1}$ (the output end of the switch element $SW_{d\_1\_1}$) and the input end of the sampling capacitor $C_{d\_2}$ (the output end of the switch element $SW_{d\_1\_2}$), and is turned on or off by the switch control signal $hld_d$. In other words, the switch element $SW_{d\_4}$ constitutes a switch unit (the first switch unit) that selectively short-circuits between the input ends of the sampling capacitors $C_{d\_1}$ and $C_{d\_2}$ under the control of the switch control signal $hld_d$.

Reset Signal Sample-and-Hold Circuit

The reset signal sample-and-hold circuit 142 includes an inverting amplifier 1421, one sampling capacitor $C_p$, and three switch elements $SW_{p\_1}$, $SW_{p\_2}$, and $SW_{p\_3}$. The inverting amplifier 1421 has a non-inverting (+) input end that is grounded and an output end that outputs a reset signal sample-hold output $V_{out\_PSH}$. The input end of the switch element $SW_{p\_1}$ is connected to the vertical signal line 32, and is turned on (closed) or off (open) by a switch control signal $smp_p$. The sampling capacitor $C_p$ has an input end connected to the output end of the switch element $SW_{p\_1}$ and an output end connected to the inverting (−) input end of the inverting amplifier 1421.

A switch element $SW_{p\_2}$ is connected between the output end of the switch element $SW_{p\_1}$ (the input end of the sampling capacitor $C_p$) and the output end of the inverting amplifier 1421, and is turned on or off by a switch control signal $hld_p$. A switch element $SW_{p\_3}$ is connected between the inverting input end (the output end of the sampling capacitor $C_p$) of the inverting amplifier 1421 and the output end of the inverting amplifier 1421, and is turned on or off by a switch control signal smpa$_p$.

Figure 5:
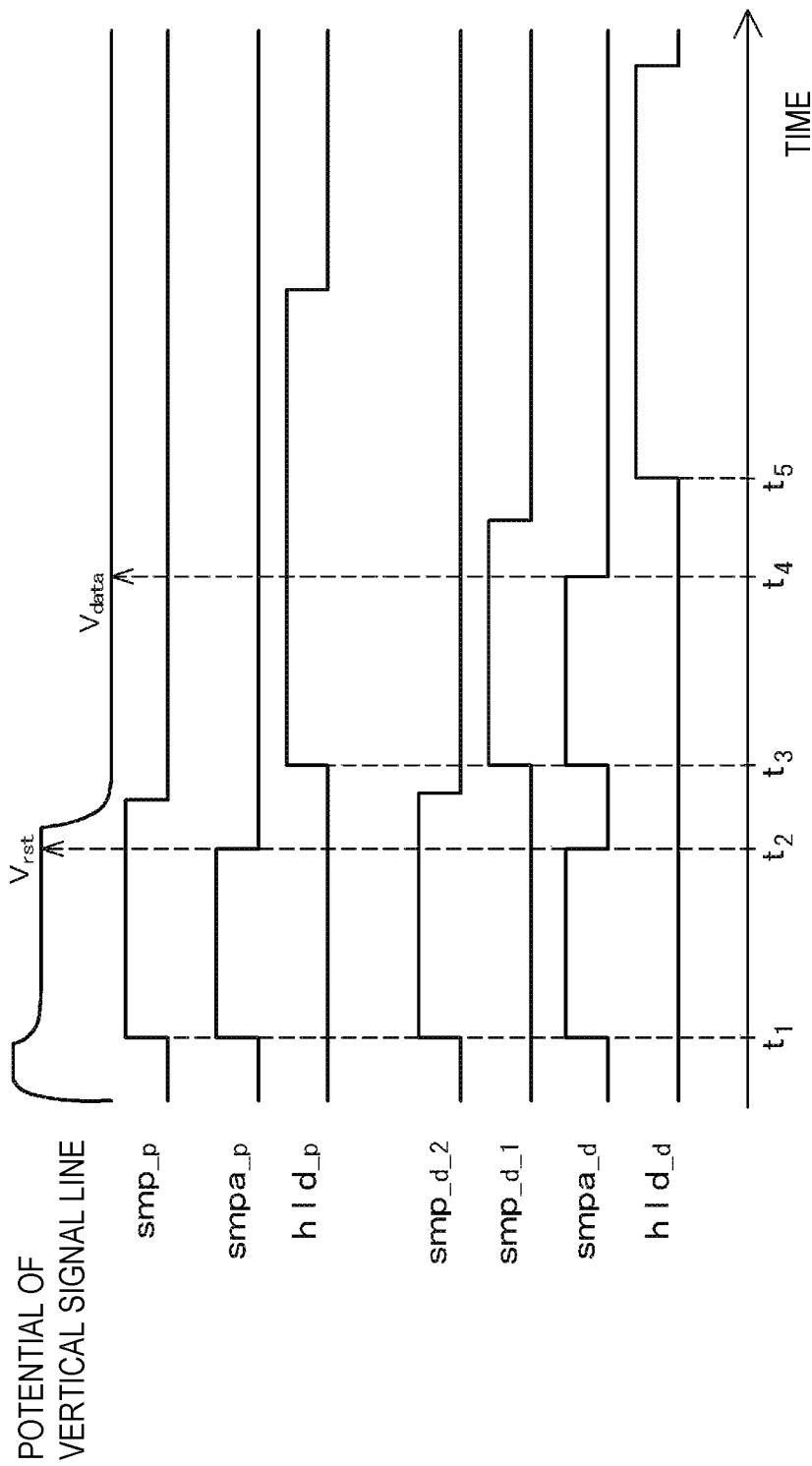
FIG. 5 is a timing waveform diagram illustrating a waveform of a potential of a vertical signal line and timing relationship between switch control signals of each switch element of two sample-and-hold circuits in the case of the first example.

FIG. 5 illustrates a waveform of the potential of the vertical signal line 32 and timing relationship between switch control signals smp$_p$, smpa$_p$, hld$_p$, smp$_{d\_1}$, smp$_{d\_2}$, smpa$_d$, and hld$_d$ of the respective switch elements of the two sample-and-hold circuits 141 and 142.

Circuit Operation

The description of a circuit operation of the sample-and-hold unit 14 according to the first example is now given with reference to the timing waveform diagram of FIG. 5.

Upon Sampling of Reset Signal

At time $t_1$, the switch control signals smp$_p$ and smpa$_p$ are at high level, and so the switch elements SW$_{p\_1}$ and SW$_{p\_3}$ in the reset signal sample-and-hold circuit 142 are turned on. Then, at time $t_2$ when the switch control signal smpa$_p$ makes transition from high level to low level, a reset signal $V_{rst}$ is sampled and accumulated in the sampling capacitor $C_p$.

At the same time when the reset signal is sampled, the switch control signals smp$_{d\_2}$ and smpa$_d$ are at high level, and so the switch elements SW$_{d\_1\_2}$ and SW$_{d\_3}$ in the data signal sample-and-hold circuit 141 are turned on. Then, at the timing (time $t_2$) when the switch control signal smpa$_d$ makes transition from high level to low level, the reset signal $V_{rst}$ in the data signal sample-and-hold circuit 141 is also sampled and accumulated in the sampling capacitor $C_{d\_2}$.

Figure 6:
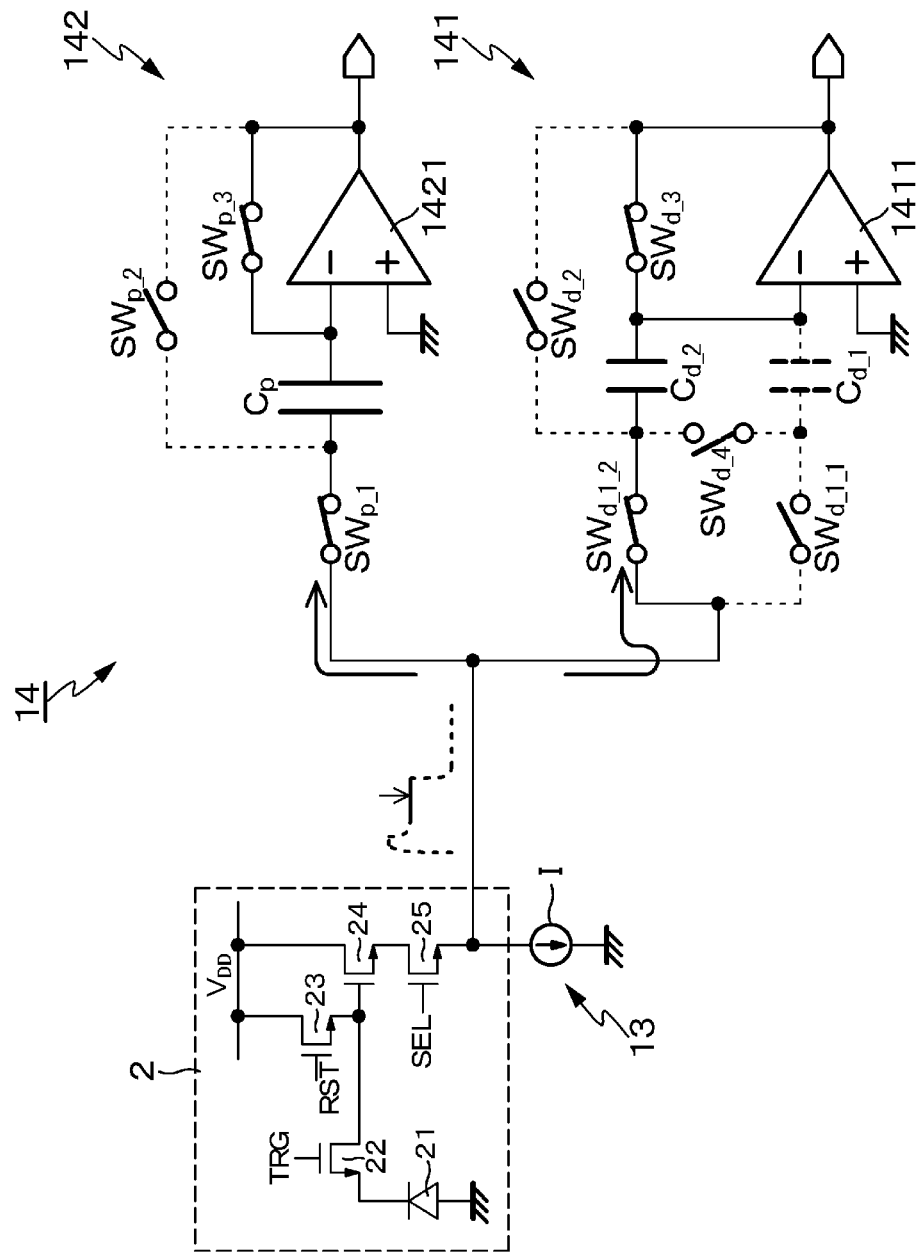
FIG. 6 is a diagram illustrated to describe an operation upon sampling a reset signal $V_{rst}$.

In other words, the reset signal $V_{rst}$ is sampled and held in the reset signal sample-and-hold circuit 142 and also sampled and held on the side of the sampling capacitor $C_{d\_2}$ of the data signal sample-and-hold circuit 141. FIG. 6 is a diagram illustrated to describe an operation upon sampling of the reset signal $V_{rst}$. In FIG. 6, the path in the non-operating state is indicated by a dotted line (similar applies to FIGS. 7 and 8).

Upon Sampling of Data Signal and Holding of Reset Signal

Subsequently, the switch control signals smp$_p$ and smp$_{d\_2}$ make transition from high level to low level and then, at time $t_3$, the switch control signals smp$_{d\_1}$ and smpa$_d$ are made to high level, so the switch elements SW$_{d\_1\_1}$ and SW$_{d\_3}$ are turned on in the data signal sample-and-hold circuit 141. Then, at time $t_4$ when the switch control signal smpa$_d$ makes transition from high level to low level, a data signal $V_{data}$ is sampled on the side of the sampling capacitor $C_{d\_1}$ in the data signal sample-and-hold circuit 141.

Figure 7:
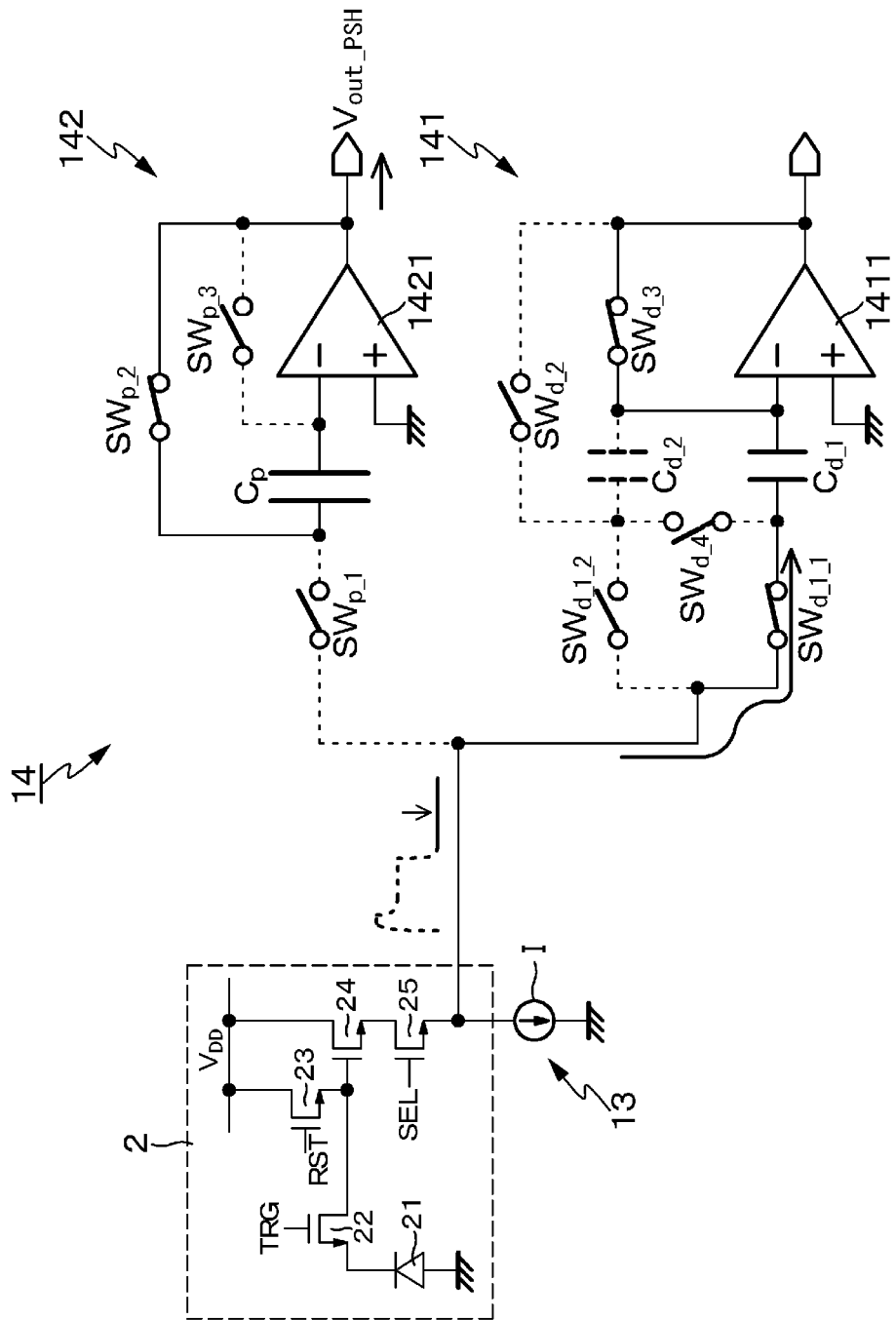
FIG. 7 is a diagram illustrated to describe an operation in the case where a data signal $V_{data}$ is sampled and a reset signal $V_{rst}$ is held.

In this period of sampling the data signal, the switch control signal hld$_p$ is made to high level and the switch element SW$_{p\_2}$ is turned on, and so the sampling capacitor $C_p$ is kept to hold the reset signal $V_{rst}$ in the reset signal sample-and-hold circuit 142. Then, the electric charge sampled and held in the sampling capacitor $C_p$ is output from the reset signal sample-and-hold circuit 142 as the reset signal sample-hold output $V_{out\_PSH}$. FIG. 7 is a diagram illustrated to describe an operation in the case where the data signal $V_{data}$ is sampled and the reset signal $V_{rst}$ is held.

Upon Holding of Data Signal and Weighted Averaging of Capacitance

Subsequently, the switch control signal smp$_{d\_1}$ makes transition from high level to low level and then, at time $t_5$, the switch control signal hld$_d$ is made to high level, so the switch elements SW$_{d\_2}$ and SW$_{d\_4}$ are turned on in the data signal sample-and-hold circuit 141. Thus, the reset signal $V_{rst}$ is held in the sampling capacitor $C_{d\_2}$, the data signal $V_{data}$ is held in the sampling capacitor $C_{d\_1}$, and the input ends of both sampling capacitors $C_{d\_1}$ and $C_{d\_2}$ are short-circuited.

Figure 8:
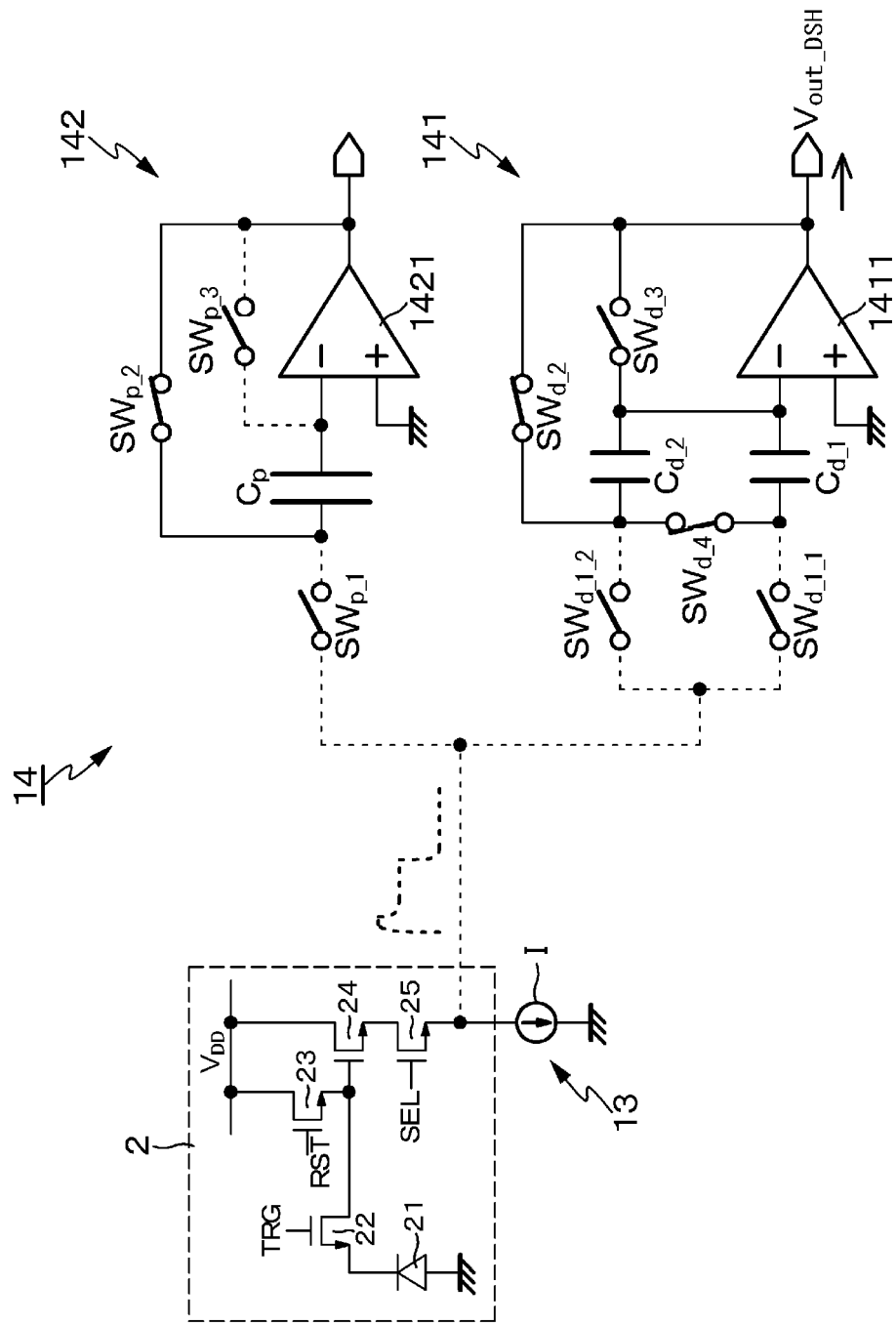
FIG. 8 is a diagram illustrated to describe an operation in the case where the data signal $V_{data}$ is held.

In this way, the short-circuiting of the input ends of the sampling capacitor $C_{d\_1}$ that samples and holds the data signal $V_{data}$ and the sampling capacitor $C_{d\_2}$ that samples and holds the reset signal $V_{rst}$ allows weighted averaging of the capacitance between the sampling capacitor $C_{d\_1}$ and the sampling capacitor $C_{d\_2}$ to be performed. The weighted averaging of the capacitance allows the level difference ($V_{rst}-V_{data}$) between the reset signal $V_{rst}$ and the data signal $V_{data}$ to be attenuated by the capacitor ratio between the sampling capacitor $C_{d\_2}$ and the sampling capacitor $C_{d\_1}$. Then, the data signal sample-hold output $V_{out\_DSH}$ is output from the data signal sample-and-hold circuit 141. FIG. 8 is a diagram illustrated to describe the operation in the case where the reset signal $V_{rst}$ and the data signal $V_{data}$ are held.

As described above, the level difference ($V_{rst}-V_{data}$) between the reset signal $V_{rst}$ and the data signal $V_{data}$ is attenuated passively by a desired ratio using the weighted averaging of the capacitance in the sample-and-hold unit 14 arranged at the entrance of the readout circuit. This makes it possible to receive an input signal in a wide voltage range without limiting the operation range of the analog circuit. Moreover, it is possible to be operated at a wide input voltage range without installing an additional circuit outside the readout circuit including the analog-to-digital conversion unit 15 or setting the power supply voltage to high level.

Second Example

Figure 9:
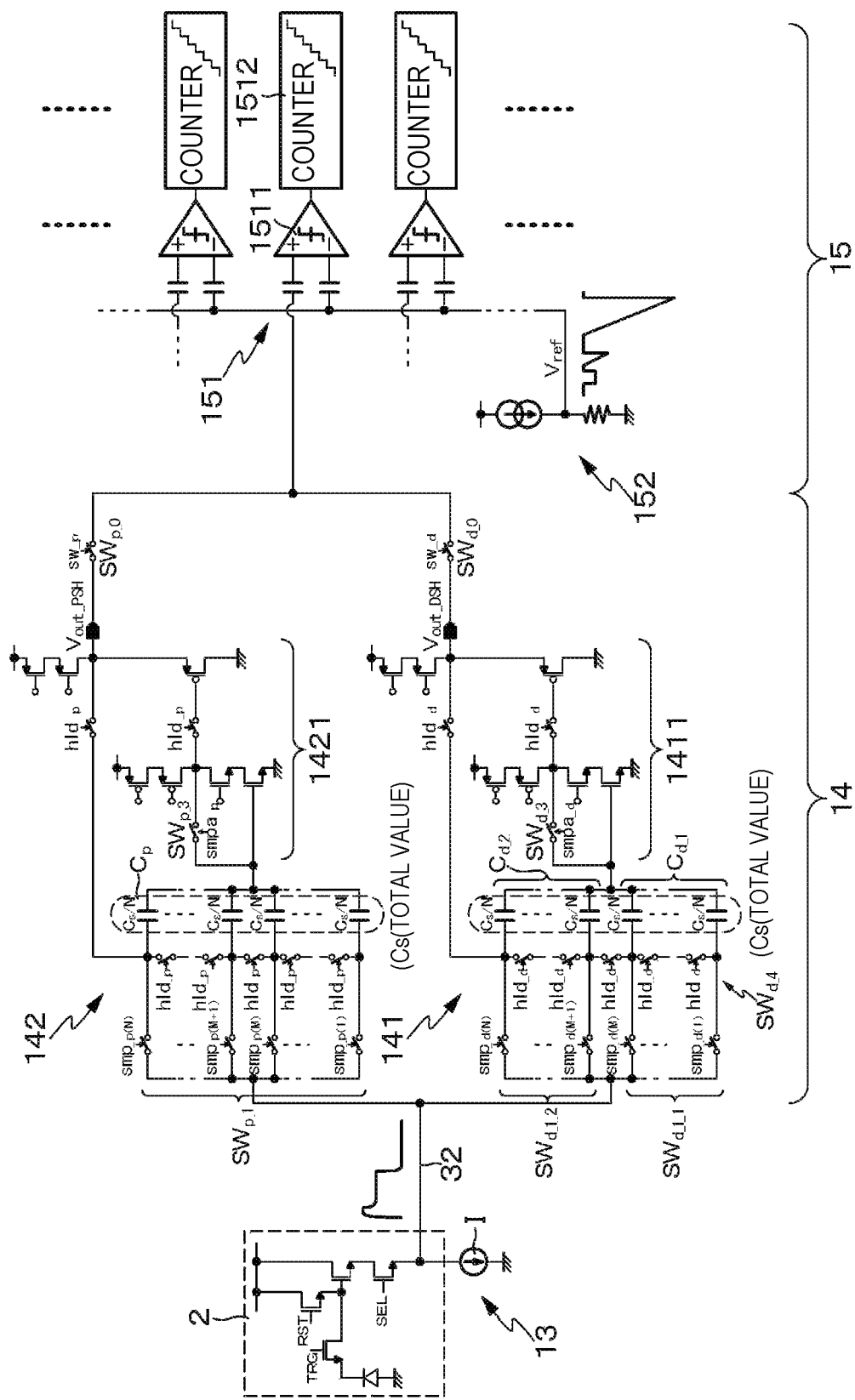
FIG. 9 is a circuit diagram illustrating circuit configuration of one-pixel column of a sample-and-hold unit and configuration of a single-slope analog-to-digital converter according to a second example.

A second example is an example in which the sampling capacitor is constituted by combination of a plurality of unit capacitors and a single-slope analog-to-digital converter is used as an analog-to-digital converter. FIG. 9 illustrates the circuit configuration of one-pixel column of a sample-and-hold unit and the configuration of a single-slope analog-to-digital converter according to the second example.

In FIG. 9, the analog-to-digital conversion unit 15 includes, in one example, a set of a plurality of analog-to-digital converters 151 provided in association with the vertical signal lines 32 ($32_1$-$32_n$). The two sample-and-hold circuits 141 and 142 are selectively connected to the associated analog-to-digital converter 151 in the analog-to-digital conversion unit 15 under the control of switch control signals sw$_p$ and sw$_d$ for switch elements SW$_{p\_0}$ and SW$_{d\_0}$.

Single-Slope Analog-to-Digital Converter

In the second example, a single-slope analog-to-digital converter 151 is used as each analog-to-digital converter of the analog-to-digital conversion unit 15. The single-slope analog-to-digital converter 151 has the circuit configuration including, in one example, a comparator 1511 and a counter 1512. In the single-slope analog-to-digital converter 151, what is called ramp (RAMP) waveform (slope waveform) reference voltage $V_{ref}$ in which the voltage value gradually changes with lapse of time is used. The reference voltage $V_{ref}$ of the ramp waveform is generated by a reference voltage generator 152. The reference voltage generator 152 can be configured using, in one example, a digital-to-analog conversion (DAC) circuit.

The comparator 1511 compares two values, one of which is the pixel signal read from the unit pixel 2 as a comparing input and the other is the reference voltage $V_{ref}$ of the ramp waveform generated by the reference voltage generator 152 a reference input. Then, the comparator 1511 has, as an output, in one example, a first state (e.g., high level) in the case where the reference voltage $V_{ref}$ is larger than the pixel signal and a second state (e.g., low level) in the case where the reference voltage $V_{ref}$ is equal to or lower than the pixel signal. This allows the output signal of the comparator 1511 to be a pulse signal having a pulse width corresponding to the magnitude of a level of the pixel signal.

The counter 1512 is supplied with a clock signal at the same timing as the supply start timing of the reference voltage $V_{ref}$ to the comparator 1511. Then, the counter 1512 performs a counting operation in synchronization with the clock signal to measure the period of the pulse width of the output pulse of the comparator 1511, that is, the period from the start of the comparison operation to the end of the comparison operation. The count result (count value) of the counter 1512 is a digital value obtained by digitizing an analog pixel signal.

As described above, the analog-to-digital conversion unit 15 using the single-slope analog-to-digital converter 151 as the analog-to-digital converter generates the reference voltage having a gradually changing analog value, and obtains the digital signal value from time information obtained until the magnitude relationship between the reference voltage and the signal voltage changes.

Data Signal Sample-and-Hold Circuit

In the data signal sample-and-hold circuit 141, the sampling capacitors $C_{d\_1}$ and $C_{d\_2}$ are constituted by combination of unit capacitors. Specifically, the sampling capacitors $C_{d\_1}$ and $C_{d\_2}$ are constituted by N (N is a positive integer) unit capacitors. In this description, assuming that the total value of capacitance values of the sampling capacitors $C_{d\_1}$ and $C_{d\_2}$ is $C_s$, each of the unit capacitors has a capacitance value of $C_s/N$.

Then, in N unit capacitors 1 to N, the sampling capacitor $C_{d\_1}$ is constituted by M unit capacitors 1 to M (M is a positive integer smaller than N) and the sampling capacitor $C_{d\_2}$ is constituted by (N−M) unit capacitors M+1 to N. This allows the capacitance value of the sampling capacitor $C_{d\_1}$ to be $C_s \times M/N$, and the capacitance value of the sampling capacitor $C_{d\_2}$ to be $C_s \times (N-M/N)$. Then, the capacitor ratio between the sampling capacitor $C_{d\_1}$ and the sampling capacitor $C_{d\_2}$ is M:N−M.

The switch element $SW_{d\_4}$ as a first switch unit that selectively short-circuits between the input ends of the sampling capacitors $C_{d\_1}$ and $C_{d\_2}$ includes a group of switches that selectively short-circuit between the input ends of unit capacitors that are adjacent to each other under the control of the switch control signal $hld_{\_d}$. In addition, the switch elements $SW_{d\_1\_1}$ and $SW_{d\_1\_2}$ as the second switch unit that selectively short-circuits between the vertical signal line 32 and the respective input ends of the sampling capacitors $C_{d\_1}$ and $C_{d\_2}$ are constituted by a group of switches provided in association with respective unit capacitors of the sampling capacitors $C_{d\_1}$ and $C_{d\_2}$.

Each switch of the switch group of the switch elements $SW_{d\_1\_1}$ and $SW_{d\_1\_2}$ selectively short-circuits between the vertical signal line 32 and each input end of the unit capacitors of the sampling capacitors $C_{d\_1}$ and $C_{d\_2}$ under the control of independent switch control signals $smp_{\_d(1)}$-$smp_{\_d(M)}$ and $smp_{\_d(M+1)}$-$smp_{\_d(N)}$. Then, the capacitor ratio between the sampling capacitor $C_{d\_1}$ and the sampling capacitor $C_{d\_2}$ is controllable by switching each switch of the switch group of the switch elements $SW_{d\_1\_1}$ and $SW_{d\_1\_2}$ on the basis of the control by the switch control signals $smp_{\_d(1)}$-$smp_{\_d(M)}$ and $smp_{\_d(M+1)}$-$smp_{\_d(N)}$.

The inverting amplifier 1411 is constituted by, in one example, combination of an N-channel source ground circuit in the preceding stage and a P-channel source follower circuit in the following stage. Then, the inverting amplifier 1411 outputs the data signal sample-hold output $V_{out\_DSH}$, and selectively supplies it to the single-slope analog-to-digital converter 151 via the switch element $SW_{d\_0}$ under the control of the switch control signal $sw_{\_d}$.

Reset Signal Sample-and-Hold Circuit

The reset signal sample-and-hold circuit 142 basically has the same circuit configuration as the data signal sample-and-hold circuit 141. In this context, the "same circuit configuration" is used as meaning including not only strictly the same circuit configuration but also substantially the same circuit configuration, and variations or the like in design or manufacture is within the scope.

Specifically, in the reset signal sample-and-hold circuit 142, the sampling capacitor $C_p$ is constituted by combination of the same number of unit capacitors as the data signal sample-and-hold circuit 141. Then, assuming that the capacitance value of the sampling capacitor $C_p$ is the total value $C_s$ of the respective capacitance values of the sampling capacitors $C_{d\_1}$ and $C_{d\_2}$, each of the unit capacitors of the sampling capacitor $C_p$ has a capacitance value of $C_s/N$.

Furthermore, a group of switches that selectively short-circuit between the input ends of unit capacitors adjacent to each other is provided on the input side of the sampling capacitor $C_p$ under the control of the switch control signal $hld_{\_p}$, which is similar to the data signal sample-and-hold circuit 141. The switch element $SW_{p\_1}$ that selectively short-circuits between the vertical signal line 32 and the input end of the sampling capacitor $C_p$ is constituted by a group of switches including N switches provided in association with each unit capacitor of the sampling capacitor $C_p$, which is similar to the data signal sample-and-hold circuit 141.

The inverting amplifier 1421 is also constituted by combination of an N-channel source ground circuit in the preceding stage and a P-channel source follower circuit in the following stage, which is similar to the inverting amplifier 1411. Then, the inverting amplifier 1421 outputs the reset signal sample-hold output $V_{out\_PSH}$, and selectively supplies it to the single-slope analog-to-digital converter 151 via the switch element $SW_{p\_0}$ under the control of the switch control signal $sw_{\_p}$.

Moreover, in the reset signal sample-and-hold circuit 142, the switch control signals $smp_{\_p(1)}$-$smp_{\_p(N)}$ used to control each switch of the switch group of the switch element $SW_d$ that selectively short-circuits between the vertical signal line 32 and each input end of the unit capacitors of the sampling capacitor $C_p$ are output at the same timing. In other words, the switch control signals $smp_{\_p(1)}$-$smp_{\_p(N)}$ perform the control of simultaneously connecting between the vertical signal line 32 and each input end of the unit capacitors of the sampling capacitor $C_p$.

In the second example, the reset signal sample-and-hold circuit 142 has the same circuit configuration as the data signal sample-and-hold circuit 141 in which the sampling capacitor $C_p$ includes N unit capacitors, but the data signal sample-and-hold circuit 141 and the reset signal sample-and-hold circuit 142 do not have necessarily the same circuit configuration. However, it is preferable that the data signal sample-and-hold circuit 141 and the reset signal sample-and-hold circuit 142 have the same circuit configuration from the viewpoint of matching between the data signal and the reset signal.

Figure 10:
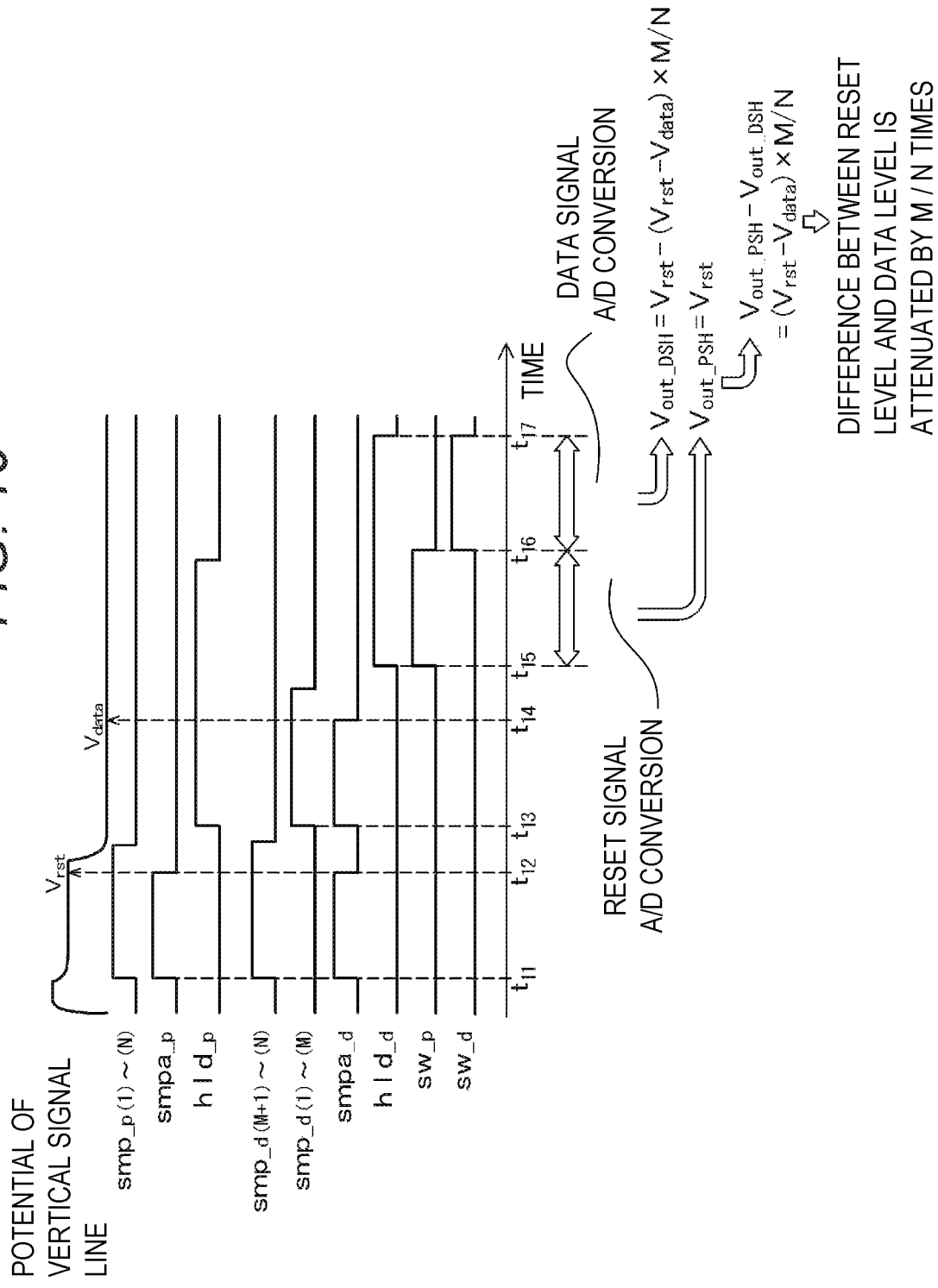
FIG. 10 is a timing waveform diagram illustrating waveform of a potential of a vertical signal line and timing relationship between switch control signals of each switch element of two sample-and-hold circuits in the case of the second example.

FIG. 10 illustrates a waveform of the potential of the vertical signal line 32 and the timing relationship of the switch control signals $smp_{\_p(1)}$-$smp_{\_p(N)}$, $smpa_{\_p}$, $hld_{\_p}$, $smp_{\_d(1)}$-$smp_{\_d(M)}$, $smp_{\_d(M+1)}$-$smp_{\_d(N)}$, $smp_{\_d}$, $hld_{\_d}$, $sw_{\_p}$, and $sw_{\_d}$ of the switch elements of the two sample-and-hold circuits 141 and 142.

Circuit Operation

The description of the circuit operation of the sample-and-hold unit 14 according to the second example is now given with reference to the timing waveform diagram of FIG. 10.

Upon Sampling of Reset Signal

At time $t_{11}$, the switch control signals $smp_{\_p(1)}$-$smp_{\_p(N)}$ and $smpa_{\_p}$ are at high level, and so N switches of the switch element $SW_{p\_1}$ and the switch element $SW_{p\_3}$ are turned on in the reset signal sample-and-hold circuit 142. Then, at time $t_{12}$ when the switch control signal $smpa_{\_p}$ makes transition from high level to low level, the reset signal $V_{rst}$ is sampled and accumulated in the sampling capacitor $C_p$.

At the same time when the reset signal is sampled, the switch control signals $smp_{\_d(M+1)}$-$smp_{\_d(N)}$ and $smpa_{\_d}$ are at high level, and so each of the switches M+1 to N of the switch elements $SW_{d\_1\_2}$ and the switch elements $SW_{d\_3}$ are turned on in the data signal sample-and-hold circuit 141. Then, at the timing (time $t_{12}$) when the switch control signal $smpa_{\_d}$ makes transition from high level to low level, the reset signal $V_{rst}$ in the data signal sample-and-hold circuit 141 is also sampled and accumulated in each of the unit capacitors M+1 to N of the sampling capacitor $C_{d\_2}$.

In other words, the reset signal $V_{rst}$ is sampled and held in the reset signal sample-and-hold circuit 142 and also sampled and held on the side of the sampling capacitor $C_{d\_2}$ of the data signal sample-and-hold circuit 141.

Upon Sampling of Data Signal and Holding of Reset Signal

Subsequently, the switch control signals $smp_{\_p(1)}$-$smp_{\_p(N)}$ and $smp_{\_d(M+1)}$-$smp_{\_d(N)}$ make transition from high level to low level and then, at time $t_{13}$, the switch control signal $smp_{\_d(1)}$-$smp_{\_d(M)}$ and $smpa_{\_d}$ are made to high level. Thus, in the data signal sample-and-hold circuit 141, each of the switches 1 to M of the switch element $SW_{d\_1\_1}$ and the switch element $SW_{d\_3}$ are turned on, and the data signal is started to be sampled and accumulated in each of the unit capacitors 1 to M of the sampling capacitor $C_{d\_1}$ at time $t_{14}$ when the switch control signal $smpa_{\_d}$ makes transition from high level to low level.

In the period of sampling the data signal, the switch control signal $hld_{\_p}$ is made to high level and so the sampling capacitor $C_p$ is kept to hold the reset signal $V_{rst}$ in the reset signal sample-and-hold circuit 142.

Upon Holding of Data Signal and Weighted Averaging of Capacitance

Subsequently, in off state of each of the switches 1 to M of the switch element $SW_{d\_1\_1}$ and each of the switches M+1 to N of the switch element $SW_{d\_1\_2}$, at time $t_{15}$, the switch control signal $hld_{\_d}$ is made to high level, and so each switch of the switch element $SW_{d\_4}$ is turned on in the data signal sample-and-hold circuit 141. This allows the input ends of the unit capacitors 1 to M of the sampling capacitor $C_{d\_1}$ and the unit capacitors M+1 to N of the sampling capacitor $C_{d\_2}$ are short-circuited, and the weighted averaging of the capacitance between the sampling capacitor $C_{d\_1}$ and the sampling capacitor $C_{d\_2}$ is performed.

In this case, a total charge $Q_{dsh}$ accumulated in the sampling capacitor $C_{d\_1}$ and the sampling capacitor $C_{d\_2}$ is given as follows, where the total value of the respective capacitance values of the sampling capacitors $C_{d\_1}$ and $C_{d\_2}$ is $C_s$.

$Q_{dsh} = C_s \times (N-M)/N \times V_{rst} + C_s \times M/N \times V_{data}$ Thus, the data signal sample-hold output $V_{out\_DSH}$ that is output from the data signal sample-and-hold circuit 141 is given as follows.

$$V_{out\_DSH} = Q_{dsh}/C_s$$

$$= (N-M)/N \times V_{rst} M/N \times V_{data}$$

$$= V_{rst} - (V_{rst} - V_{data}) \times M/N$$

Upon Analog-to-Digital Conversion

The sample-hold output $V_{out\_PSH}$ of the reset signal sample-and-hold circuit 142 is supplied to the single-slope analog-to-digital converter 151 to perform analog-to-digital conversion during ON period of the switch element $SW_{p\_0}$ controlled by the switch control signal $sw_{\_p}$ in the period from time $t_{15}$ to $t_{16}$. The sample-hold output $V_{out\_DSH}$ of the data signal sample-and-hold circuit 141 is supplied to the single-slope analog-to-digital converter 151 to perform analog-to-digital conversion during ON period of the switch element $SW_{d\_0}$ controlled by the switch control signal $sw_{\_d}$ in the period from time $t_{16}$ to $t_{17}$.

The analog-to-digital conversion results of the sample-hold output $V_{out\_PSH}$ and the sample-hold output $V_{out\_DSH}$ are subjected to the processing for noise removal called correlated double sampling (CDS) by obtaining a difference in the data processing unit 17 in the following stage. The difference $V_{out\_PSH} - V_{out\_DSH}$ is given as follows.

$V_{out\_PSH} - V_{out\_DSH} = (V_{rst} - V_{data}) \times M/N$ This shows that the difference $(V_{rst} - V_{data})$ between the reset signal $V_{rst}$ and the data signal $V_{data}$ is attenuated by M/N times.

In the above example, one analog-to-digital converter 151 is used by being switched for the sample-hold output $V_{out\_PSH}$ and the sample-hold output $V_{out\_DSH}$ to perform the analog-to-digital conversion processing under the control of the switch control signals $sw_{\_p}$ and $sw_{\_d}$, but the configuration is not limited to this example. In one example, one analog-to-digital converter 151 may be provided individually for each of the sample-hold output $V_{out\_PSH}$ and the sample-hold output $V_{out\_DSH}$.

As described above, the level difference $(V_{rst} - V_{data})$ between the reset signal $V_{rst}$ and the data signal $V_{data}$ is attenuated passively by a desired ratio using the weighted averaging of the capacitance in the sample-and-hold unit 14 arranged at the entrance of the readout circuit. This makes it possible to receive an input signal in a wide voltage range without limiting the operation range of the analog circuit. This attenuation operation passively performed by the weighted averaging of capacitance allows the voltage range of the input signal to be less restrictive, and in the case where the attenuated signal $(V_{rst}-V_{data}) \times M/N$ satisfies the circuit operating point, in one example, if N=2 and M=1 (the first example), it is possible to receive a signal twice as large as the case where the technology according to the present disclosure is not used.

Further, the relationship between the magnitude of the input signal to the vertical signal line 32 and the full-scale and size of 1 LSB of the analog-to-digital conversion as viewed from the input of the vertical signal line 32 is possible to be adjusted by multiplying N/M using analog or logic means after sampling and holding. In one example, in the case where the signal is halved by the weighted averaging of the capacitance in the sample-and-hold unit 14, the signal is doubled using analog or logic means after sampling and holding.

Third Example

Figure 11:
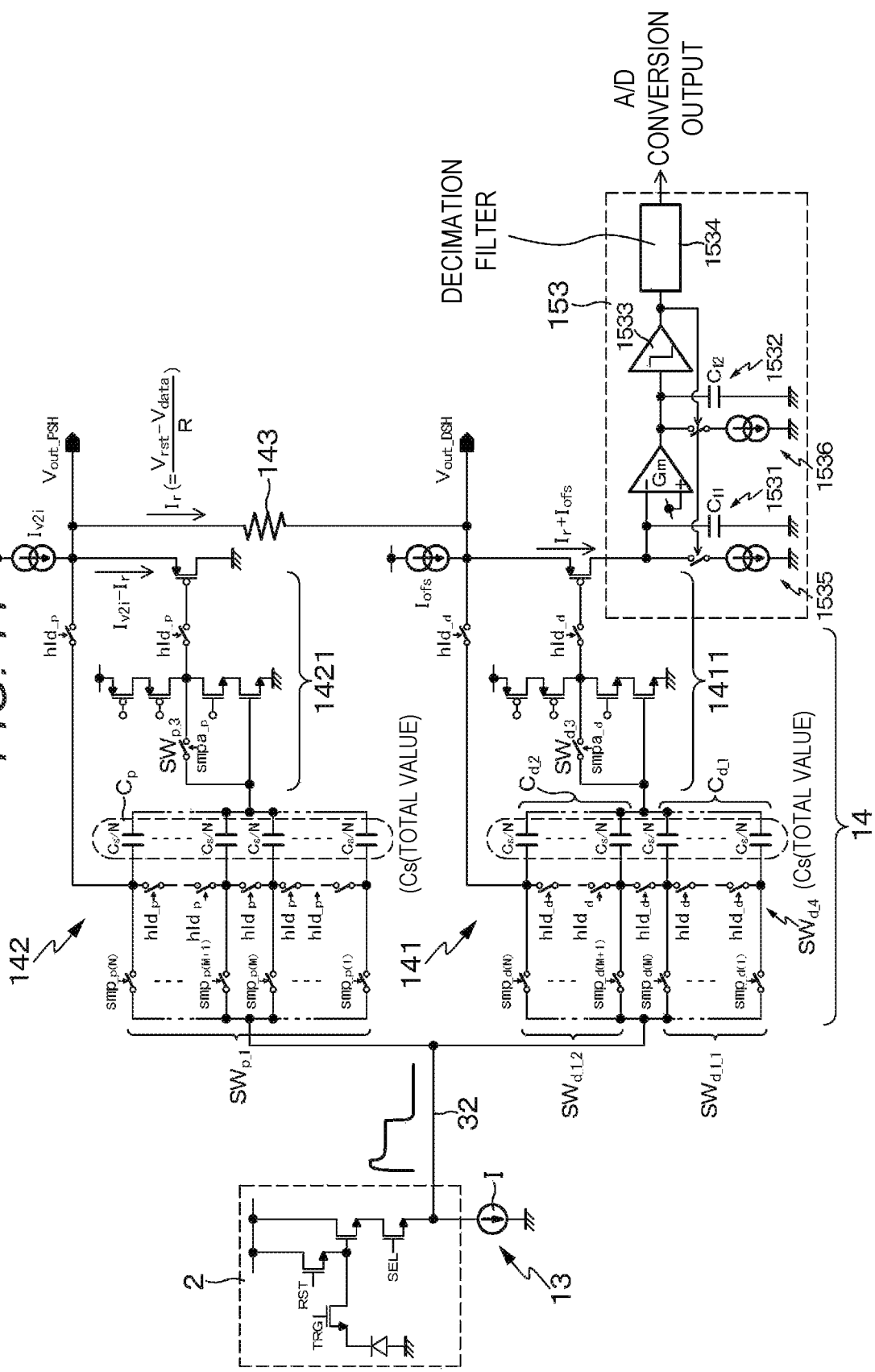
FIG. 11 is a circuit diagram illustrating circuit configuration of one-pixel column of a sample-and-hold unit and configuration of a delta-sigma analog-to-digital converter according to a third example.

A third example is an example in which a sampling capacitor is constituted by combination of a plurality of unit capacitors and a delta-sigma (ΔΣ) analog-to-digital converter is used as the analog-to-digital converter. FIG. 11 illustrates the circuit configuration of one-pixel column of a sample-and-hold unit according to the third example and the configuration of the analog-to-digital conversion unit.

In the third example, a delta-sigma analog-to-digital converter 153 is used as each analog-to-digital converter of the analog-to-digital conversion unit 15. The delta-sigma analog-to-digital converter 153 includes, in one example, a first integrator 1531, a second integrator 1532, a quantizer 1533, and a decimation filter 1534.

In the delta-sigma analog-to-digital converter 153, the first integrator 1531 includes an integration capacitor $C_{11}$. The first integrator 1531 has an input node connected to a first digital-analog converter 1535. The first digital-analog converter 1535 performs ON or OFF control of current to the first integrator 1531 in response to the digital signal passed via the second integrator 1532 and the quantizer 1533.

The second integrator 1532 includes a Gm-cell that converts voltage into current and an integration capacitor $C_{12}$. The second integrator 1532 has an input node connected to a second digital-analog converter 1536. The second digital-analog converter 1536 performs ON or OFF control of current to the second integrator 1532 depending on the result obtained by quantization of the output of the second integrator 1532 by the quantizer 1533.

Moreover, the configuration of the delta-sigma analog-to-digital converter 153 exemplified in this description is an example, and it is not limited to this exemplary configuration.

In the sample-and-hold unit 14 according to the third example, the configuration other than the delta-sigma analog-to-digital converter 153, specifically, the circuit configuration of the data signal sample-and-hold circuit 141 and the reset signal sample-and-hold circuit 142 is basically the same as the case of the second example.

Figure 12:
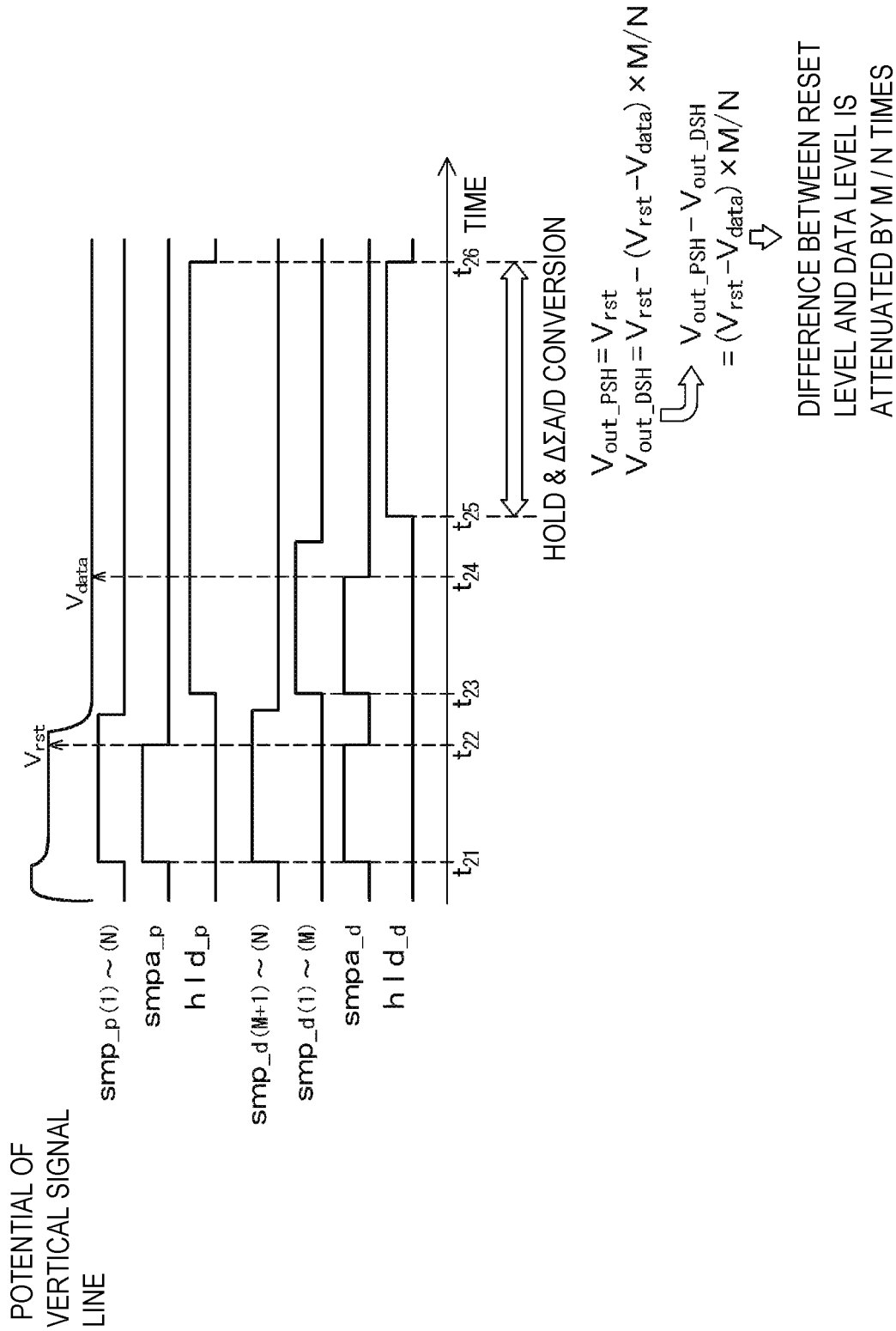
FIG. 12 is a timing waveform diagram illustrating waveform of a potential of a vertical signal line and timing relationship between switch control signals of each switch element of two sample-and-hold circuits in the case of the third example.

FIG. 12 illustrates the waveform of the potential of the vertical signal line 32 and the timing relationship between the switch control signals $smp_{p(1)}$-$smp_{p(N)}$, $smpa_p$, $hld_p$, $smp_{d(1)}$-$smp_{d(M)}$, $smp_{d(M+1)}$-$smp_{d(N)}$, $smpa_d$, and $hld_d$ of the switch elements of the two sample-and-hold circuits 141 and 142.

In FIG. 11, a resistance element 143 is connected between the output end of the data signal sample-and-hold circuit 141 and the output end of the reset signal sample-and-hold circuit 142. Thus, the current $I_r$ flowing through the resistance element 143 during the hold period $t_{25}$-$t_{26}$ in the timing waveform diagram of FIG. 12, that is, the period during the switch control signals $hld_p$ and $hld_d$ are both at high level) is given as follows, where the resistance value of the resistance element 143 is R.

$I_r = (V_{rst}-V_{data})/R$ This current $I_r$ is input to the first integrator 1531 of the delta-sigma analog-to-digital converter 153.

In this case, the current $I_r$ flowing through the resistance element 143 is proportional to the difference $(V_{rst}-V_{data})$ between the reset signal $V_{rst}$ and the data signal $V_{data}$ of the pixel signal and so the CDS technique is performed in the stage where the current $I_r$ is input to the delta-sigma analog-to-digital converter 153. In this context, current $I_{v2i}$ of the current source of the P-channel source follower circuit in the following stage in the inverting amplifier 1421 is branched into the component $I_r$ flowing through the resistance element 143 and a component $I_{v2i}$-$I_r$ flowing through the P-channel source follower circuit. Thus, the current $I_{v2i}$ is necessary to be larger than the maximum value $I_r$ of the current flowing through the resistance element 143 to achieve stable circuit operation.

In the delta-sigma analog-to-digital converter 153, the previous quantized value in the quantizer 1533 is fed back to the second integrator 1532 and the first integrator 1531 through a second digital-to-analog converter 1536 and a first digital-to-analog converter 1535.

In this way, it is possible to obtain a second-order noise shaping characteristic by passing the integrator twice while feeding back the previous quantized value to the first digital-analog converter 1535 and the second digital-analog converter 1536. In addition, it is possible to obtain a high-precision analog-to-digital conversion output by removing high-frequency noise by the decimation filter 1534 in the following stage of the quantizer 1533.

Modification of Embodiment

Although the above-described embodiments describe the case where the technology according to the present disclosure is applied to the CMOS image sensor in which unit pixels 2 are arranged in a matrix as an example, it is not limited to application to the CMOS image sensor. In other words, the technology according to the present disclosure is applicable to all types of solid-state image sensors using the X-Y address method in which unit pixels 2 are two-dimensionally arranged in a matrix.

Further, the technology according to the present disclosure is not limited to application to a solid-state image sensor that detects the distribution of the amount of incident light of visible light and captures it as an image. The technology according to the present disclosure is applicable to all types of solid-state image sensor that captures the distribution of incident amounts of infrared rays, X-rays, particles, or the like as an image.

Application Example of Embodiment

Figure 13:
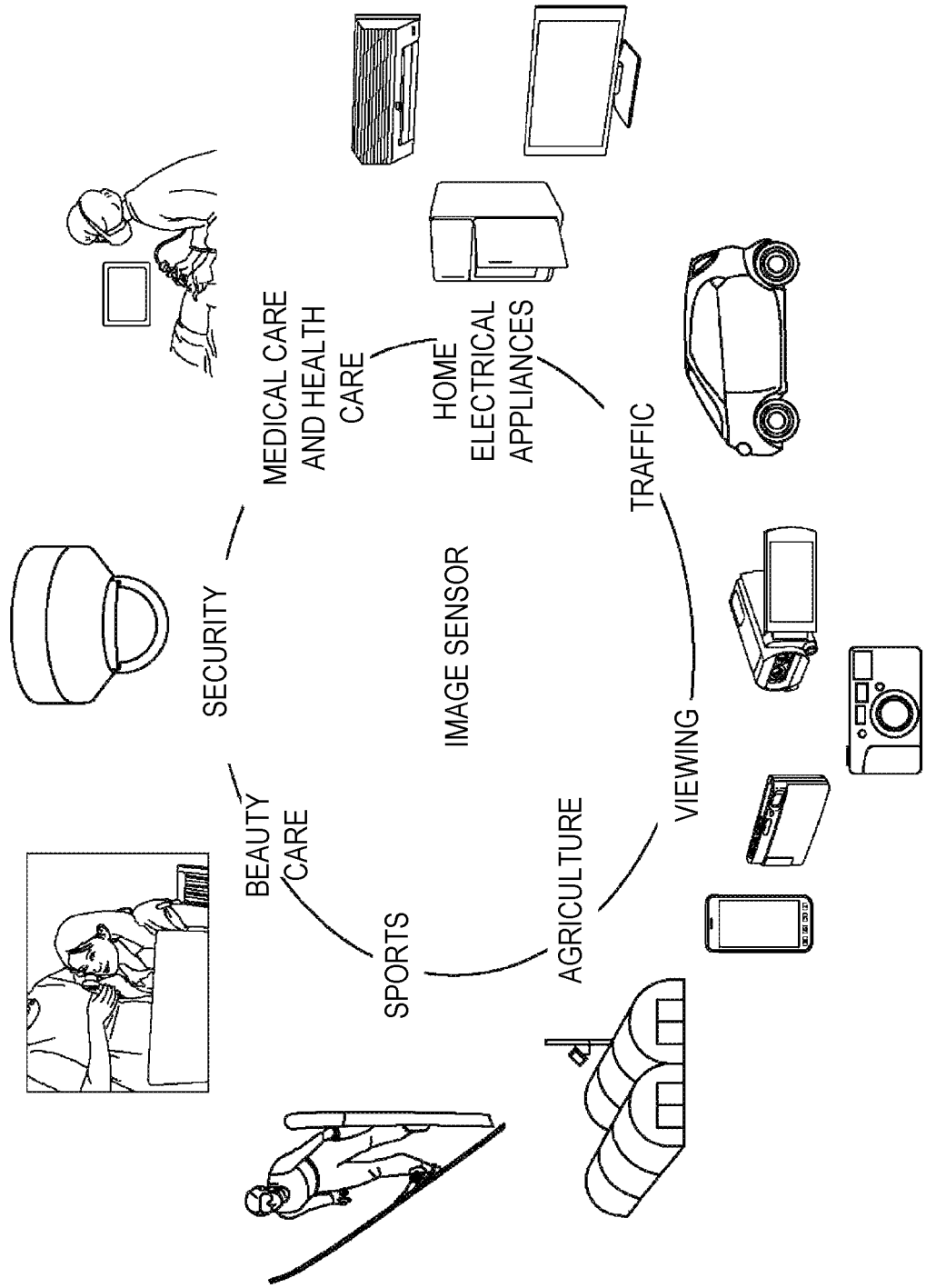
FIG. 13 is a diagram illustrating an applied example of technology according to the present disclosure.

The CMOS image sensor 1 according to the present embodiment described above is capable of being used for various devices for sensing light such as visible light, infrared light, ultraviolet light, and X-ray as illustrated, in one example, in FIG. 13. Specific examples of various devices are listed below.

Devices used to capture images for appreciation, such as digital cameras and portable equipment provided with camera function Devices used in the field of traffic, such as in-vehicle sensors that captures images of the front, rear, surroundings, interior, or the like of vehicles for safe driving including automatic stop and recognition of the driver's condition, monitoring cameras for monitoring traveling vehicles and roads, and ranging sensors that measure distance between vehicles Devices used in the field of home appliances, such as television sets, refrigerators, and air conditioners, for capturing images of user's gestures and performing device operations in accordance with the gestures Devices used in the field of medical and healthcare, such as endoscopes and instruments that perform angiography by receiving infrared light Devices used in the field of security, such as security surveillance cameras and personal authentication cameras Devices used in the field of beauty, such as skin measuring instruments for capturing images of skin and microscopes for capturing images of scalp Devices used in the field of sports, such as action cameras and wearable cameras for sports application Devices used in the field of agriculture, such as cameras for monitoring condition of farms or crops Applied Example of Technology According to Present Disclosure The technology according to the present disclosure is applicable to various products. The description of more specific applied examples is now given.

Electronic Apparatus of Present Disclosure

The description is now given of a case where the present invention is applied to an electronic apparatus including an image-capturing device such as digital still cameras or video cameras, a portable terminal device provided with an image-capturing function such as mobile phones, or a copying machine using a solid-state image sensor for an image readout unit.

Figure 14:
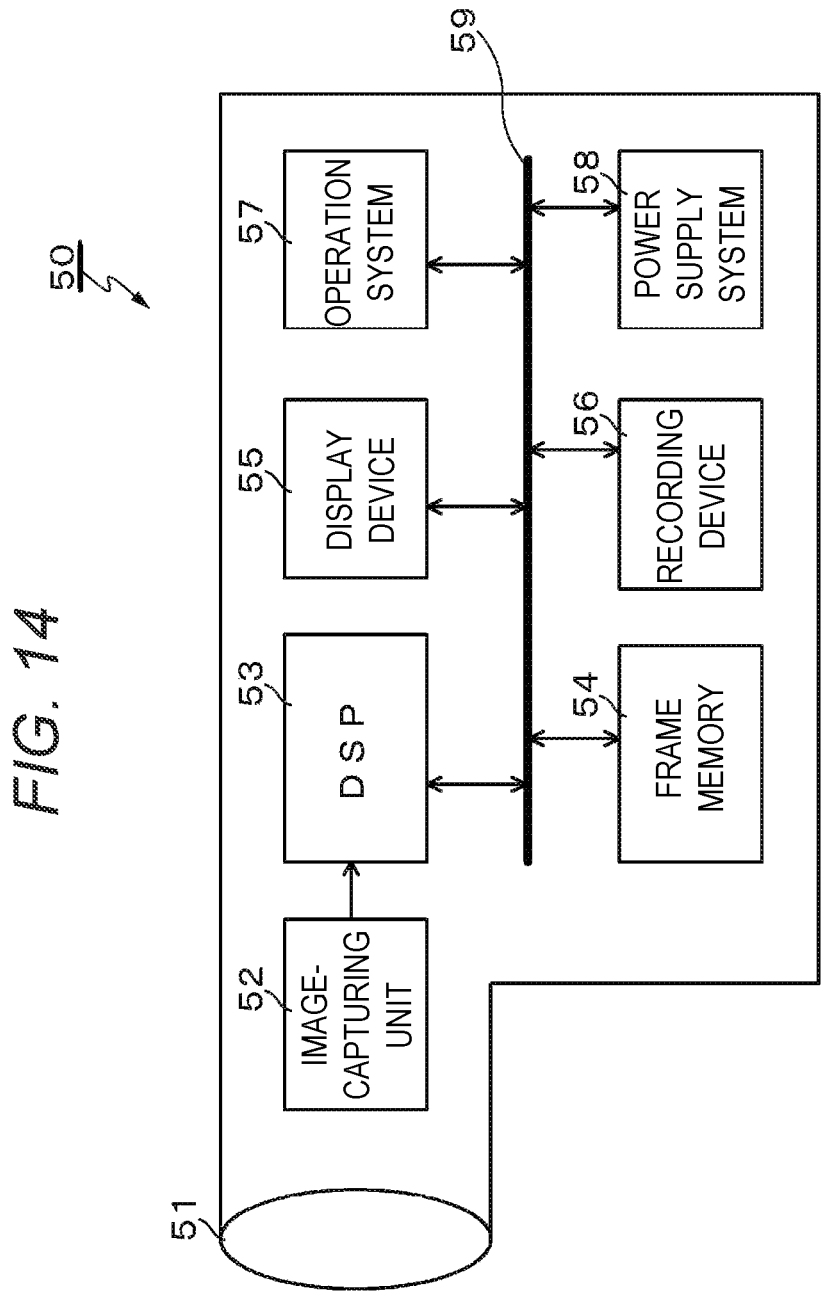
FIG. 14 is a block diagram illustrating configuration of an image-capturing device that is one example of the electronic apparatus of the present disclosure.

FIG. 14 is a block diagram illustrating configuration of an image-capturing device that is an example of the electronic apparatus of the present disclosure. As illustrated in FIG. 14, an image-capturing device 50 according to this example has an image-capturing optical system 51 including a lens group or the like, an image-capturing unit 52, a DSP circuit 53, a frame memory 54, a display device 55, a recording device 56, an operation system 57, a power supply system 58, or the like. In addition, the DSP circuit 53, the frame memory 54, the display device 55, the recording device 56, the operation system 57, and the power supply system 58 are connected to each other via a bus line 59.

The image-capturing optical system 51 captures incident light (image light) from a photographic subject and forms an image on the image-capturing surface of the image-capturing unit 52. The image-capturing unit 52 converts the light amount of incident light formed on the image-capturing surface by the image-capturing optical system 51 into an electrical signal for each pixel and outputs the electrical signal as a pixel signal. The DSP circuit 53 performs typical camera signal processing, such as white balance processing, de-mosaic processing, and gamma correction processing.

The frame memory 54 is used for storing data as appropriate in the process of signal processing in the DSP circuit 53. The display device 55 includes a panel-equipped display device such as a liquid crystal display device or an organic electroluminescence (EL) display device, and displays a moving image or a still image captured by the image-capturing unit 52. The recording device 56 records the moving image or still image captured by the image-capturing unit 52 on a recording medium such as a portable semiconductor memory, an optical disk, or a hard disk drive (HDD).

The operation system 57 issues operation commands for various functions of the image-capturing device 50 according to this example in response to the operation of the user. The power supply system 58 appropriately supplies various power supplies acting as operation power supplies for the DSP circuit 53, the frame memory 54, the display device 55, the recording device 56, and the operation system 57 to these power supply targets.

The image-capturing device 50 as described above is applied to a camera module for mobile devices such as video cameras, digital still cameras, and even smartphones, or cellular phones. In addition, this image-capturing device 50 is capable of employing, as the image-capturing unit 52, the CMOS image sensor according to the embodiments described above, which is operable at a wide input voltage range without installing an additional circuit outside the readout circuit or setting the power supply voltage to high level. This makes it possible to implement the image-capturing device 50 that eliminates a concern about an increase in circuit scale due to installing an additional circuit or deterioration of noise characteristics due to the additional circuit.

Application Example to Moving Object

The technology according to the present disclosure can be applied to various products. For example, the technology according to the present disclosure is implemented as apparatuses mounted on any type of mobile bodies such as automobiles, electric vehicles, hybrid electric vehicles, motorcycles, bicycles, personal mobilities, airplanes, drones, ships, robots, construction machines, and agricultural machines (tractors).

Figure 15:
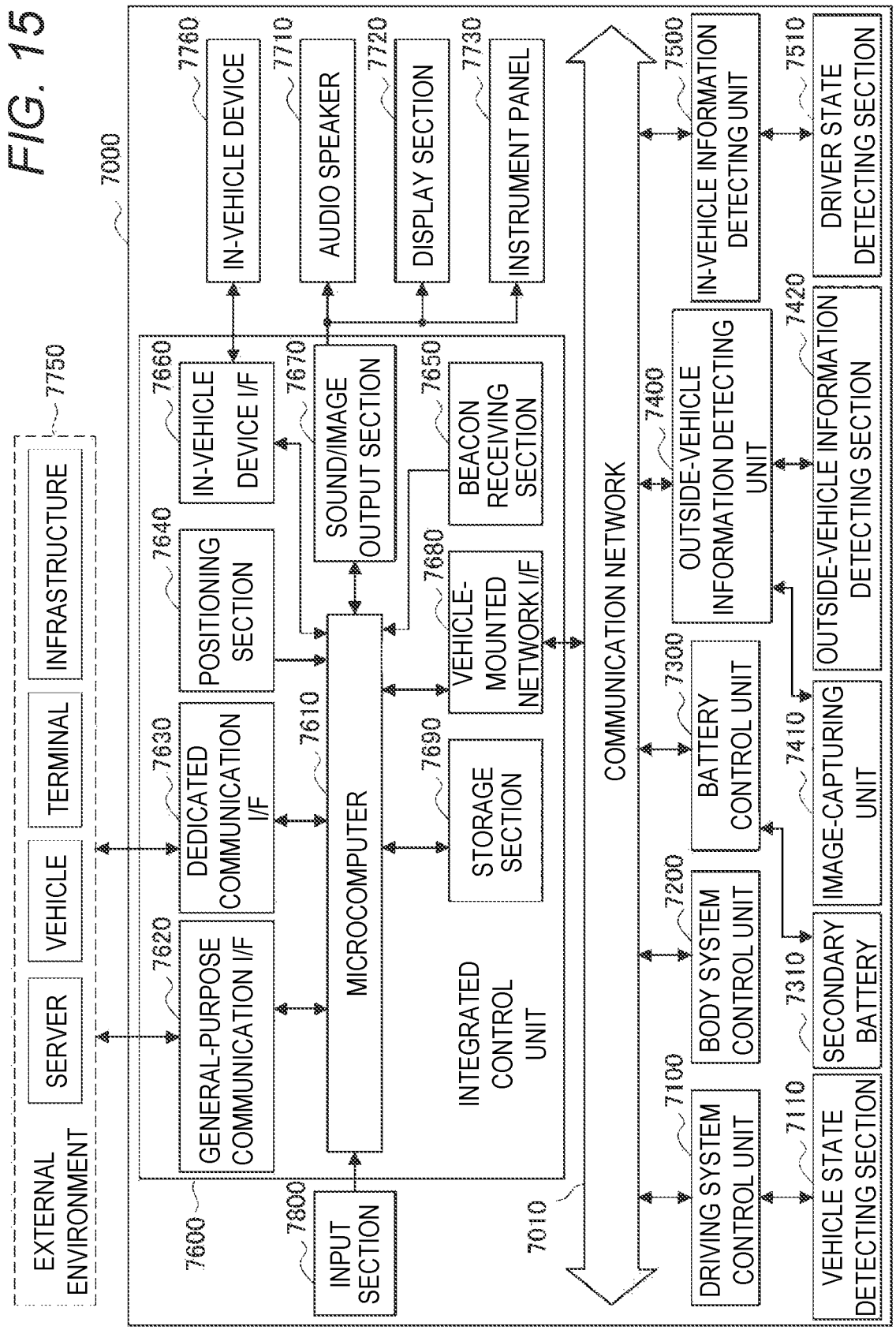
FIG. 15 is a block diagram illustrating schematic configuration example of a vehicle control system that is one example of a moving object control system to which the technology according to the present disclosure is applicable.

FIG. 15 is a block diagram depicting an example of schematic configuration of a vehicle control system 7000 as an example of a mobile body control system to which the technology according to the present disclosure can be applied. The vehicle control system 7000 includes a plurality of electronic control units connected to each other via a communication network 7010. In the example depicted in FIG. 15, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or wireless communication. A functional configuration of the integrated control unit 7600 illustrated in FIG. 15 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, or sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a back lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an image-capturing unit 7410 or an outside-vehicle information detecting section 7420. The image-capturing unit 7410 includes at least one of a time-of-flight (ToF) camera, a stereo camera, a monocular camera, an infrared camera, or other cameras. The outside-vehicle information detecting section 7420, for example, includes at least one of an environmental sensor for detecting current atmospheric conditions or weather conditions or a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, or a snow sensor detecting a snowfall. The peripheral information detecting sensor may be at least one of an ultrasonic sensor, a radar device, or a LIDAR device (light detection and ranging device, or Laser imaging detection and ranging device). Each of the image-capturing unit 7410 and the outside-vehicle information detecting section 7420 may be provided as an independent sensor or device, or may be provided as a device in which a plurality of sensors or devices integrated.

Figure 16:
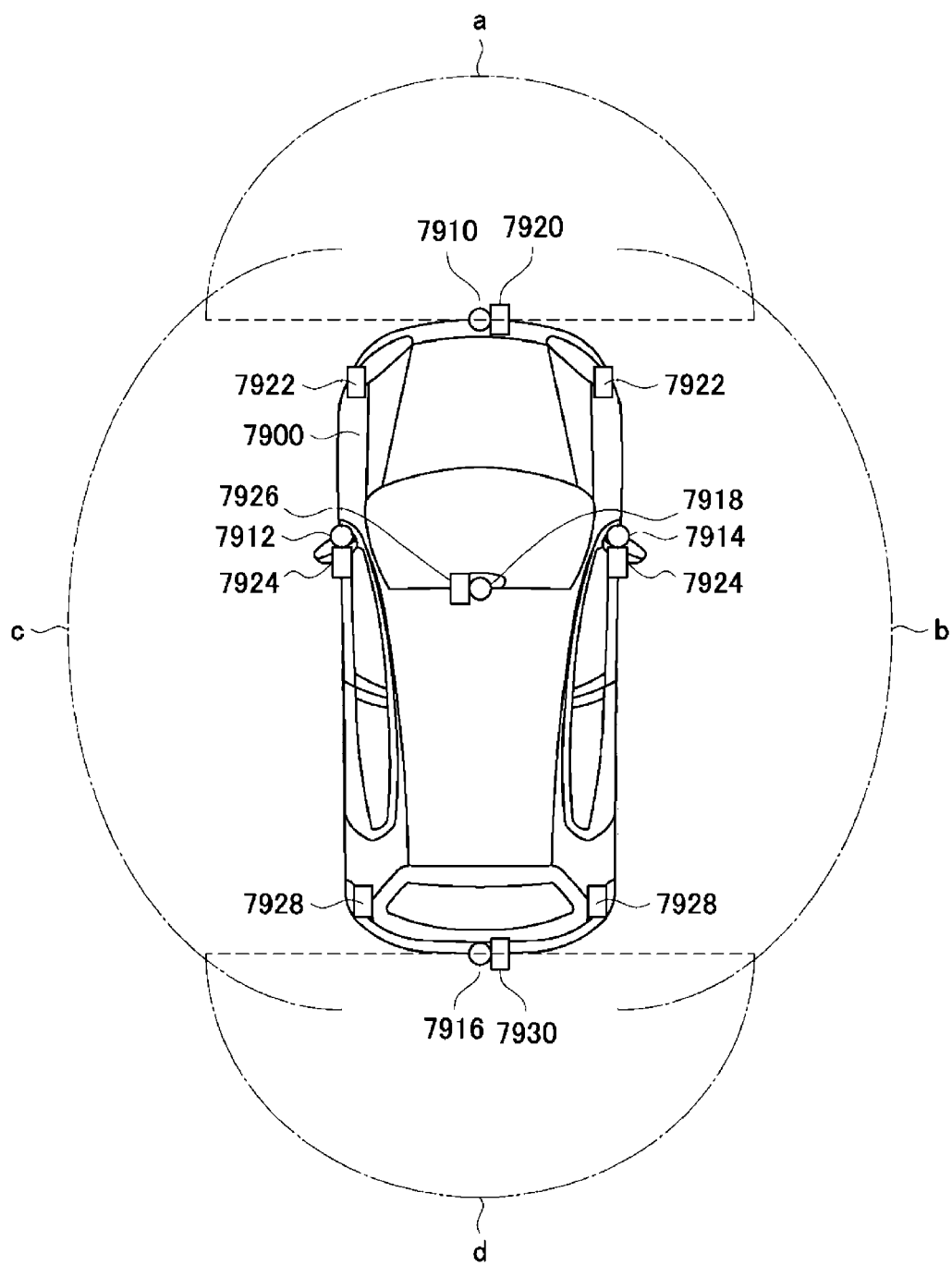
FIG. 16 is a diagram illustrating an example of an installation position of an image-capturing unit.

Here, FIG. 16 depicts an example of installation positions of the image-capturing unit 7410 and the outside-vehicle information detecting section 7420. image-capturing units 7910, 7912, 7914, 7916, and 7918 are, for example, disposed at least one of positions on a front nose, sideview mirrors, a rear bumper, or a back door and an upper portion of a windshield within the interior of the vehicle of the vehicle 7900. The image-capturing unit 7910 provided to the front nose and the image-capturing unit 7918 provided to the upper portion of the windshield within the interior of the vehicle obtain mainly an image of the front of the vehicle 7900. The image-capturing units 7912 and 7914 provided to the sideview mirrors obtain mainly an image of the sides of the vehicle 7900. The image-capturing unit 7916 provided to the rear bumper or the back door obtains mainly an image of the rear of the vehicle 7900. The image-capturing unit 7918 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of image-capturing ranges of the respective image-capturing units 7910, 7912, 7914, and 7916. An image-capturing range a represents the image-capturing range of the image-capturing unit 7910 provided to the front nose. Image-capturing ranges b and c respectively represent the image-capturing ranges of the image-capturing units 7912 and 7914 provided to the sideview mirrors. An image-capturing range d represents the image-capturing range of the image-capturing unit 7916 provided to the rear bumper or the back door. A bird's-eye image of the vehicle 7900 as viewed from above can be obtained by superimposing image data imaged by the image-capturing units 7910, 7912, 7914, and 7916, for example.

Outside-vehicle information detecting sections 7920, 7922, 7924, 7926, 7928, and 7930 provided to the front, rear, sides, corners, and the upper portion of the windshield within the interior of the vehicle of the vehicle 7900 may be, for example, an ultrasonic sensor or a radar device. The outside-vehicle information detecting sections 7920, 7926, and 7930 provided to the front nose, the rear bumper, the back door, and the upper portion of the windshield within the interior of the vehicle of the vehicle 7900 may be a LIDAR device, for example. These outside-vehicle information detecting sections 7920 to 7930 are used mainly to detect a preceding vehicle, a pedestrian, an obstacle, or the like.

Returning to FIG. 15, the description will be continued. The outside-vehicle information detecting unit 7400 makes the image-capturing unit 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different image-capturing units 7410 to generate a bird's-eye image or a panoramic image. The outside-vehicle information detecting unit 7400 may perform viewpoint conversion processing using the image data imaged by the different image-capturing units 7410.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM, registered trademark), worldwide interoperability for microwave access (WiMAX), long term evolution (LTE)), LTE-advanced (LTE-A), or the like, or another wireless communication protocol such as wireless LAN (referred to also as wireless fidelity (Wi-Fi), Bluetooth, or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handy phone system (PHS), or a smart phone that has a positioning function.

The beacon receiving section 7650, for example, receives a radio wave or an electromagnetic wave transmitted from a wireless station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI, registered trademark), mobile high-definition link (MHL), or the like via a connection terminal (and a cable if necessary) not depicted in the figures. The in-vehicle devices 7760 may, for example, include at least one of a mobile device and a wearable device possessed by an occupant or an information device carried into or attached to the vehicle. Further, the in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, or the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, or the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound or an image to an output device capable of visually or auditorily notifying an occupant of the vehicle or the outside of the vehicle of information. In the example of FIG. 15, an audio speaker 7710, a display section 7720, and an instrument panel 7730 are illustrated as the output device. The display section 7720 may, for example, include at least one of an on-board display or a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 15 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

The exemplary vehicle control system to which the technology according to the present disclosure is applicable is described above. The technology according to the present disclosure is applicable to, in one example, the image-capturing units 7910, 7912, 7914, 7916, and 7918 and the outside-vehicle information detecting sections 7920, 7922, 7924, 7926, 7928, and 7930 among the components described above. Specifically, the CMOS image sensor 1 in FIG. 1 is applicable to, in one example, the image-capturing unit 7410, image-capturing units 7910, 7912, 7914, 7916, and 7918, and outside-vehicle information detecting sections 7920, 7922, 7924, 7926, 7928, and 7930. The technology according to the present disclosure applied to the image-capturing units 7910, 7912, 7914, 7916, and 7918 or the outside-vehicle information detecting sections 7920, 7922, 7924, 7926, 7928, and 7930 makes it possible to construct the vehicle control system that eliminates a concern about increase in circuit scale due to the installing an additional circuit or deterioration of noise characteristics due to the additional circuit.

Configuration That Can Be Configured By Present Disclosure

Note that the present disclosure may include the following configuration.

A. Solid-State Image Sensor

[A-1] A solid-state image sensor including:
a pixel array section including a plurality of unit pixels each having a photoelectric conversion unit, the plurality of unit pixels being arranged in a matrix;
a sample-and-hold unit configured to sample and hold a pixel signal output from the unit pixel through a vertical signal line provided in association with column arrangement of the pixel array section; and
an analog-to-digital conversion unit configured to convert a pixel signal output from the sample-and-hold unit into a digital signal,
in which the sample-and-hold unit has two sample-and-hold circuits in parallel for one vertical signal line, and
at least one of the two sample-and-hold circuits has at least two sampling capacitors.
[A-2] The solid-state image sensor according to [A-1] described above,
in which the solid-state image sensor has a stacked structure including at least two semiconductor substrates of a first semiconductor substrate and a second semiconductor substrate arranged on top of each other,
the pixel array section is formed on the first semiconductor substrate, and
the sample-and-hold unit is formed on a semiconductor substrate other than the first semiconductor substrate.
[A-3] The solid-state image sensor according to [A-1] or [A-2] described above,
in which at least one of the two sample-and-hold circuits has a first switch unit configured to selectively short-circuit between input ends of the sampling capacitor.
[A-4] The solid-state image sensor according to [A-3] described above,
in which each of at least two of the sampling capacitors includes combination of a plurality of unit capacitors.
[A-5] The solid-state image sensor according to [A-4] described above,
in which at least one of the two sample-and-hold circuits has a second switch unit including a group of switches configured to selectively short-circuit between the vertical signal line and each input end of the plurality of unit capacitors by an independent control signal, and
the first switch unit includes a group of switches configured to selectively short-circuit between the input ends of the unit capacitors adjacent to each other.
[A-6] The solid-state image sensor according to any one of [A-3] to [A-5] described above,
in which the pixel signal includes a reset signal output from the unit pixel upon being reset and a data signal output from the unit pixel upon being photo-electrically converted, and
one of the two sample-and-hold circuits has a sampling capacitor configured to sample the reset signal and a sampling capacitor configured to sample the data signal.
[A-7] The solid-state image sensor according to [A-6] described above,
in which a capacitor ratio between the sampling capacitor configured to sample the reset signal and the sampling capacitor configured to sample the data signal is controllable by switching each switch of a group of switches of a second switch unit.
[A-8] The solid-state image sensor according to any one of [A-1] to [A-7] described above,
in which the two sample-and-hold circuits have identical circuit configuration.
[A-9] The solid-state image sensor according to any one of [A-1] to [A-8] described above,
in which the analog-to-digital conversion unit includes a single-slope analog-to-digital converter.
[A-10] The solid-state image sensor according to any one of [A-1] to [A-8] described above,
in which the analog-to-digital conversion unit includes a delta-sigma analog-to-digital converter.

B. Electronic Apparatus

[B-1] An electronic apparatus including a solid-state image sensor including
a pixel array section including a plurality of unit pixels each having a photoelectric conversion unit, the plurality of unit pixels being arranged in a matrix,
a sample-and-hold unit configured to sample and hold a pixel signal output from the unit pixel through a vertical signal line provided in association with column arrangement of the pixel array section, and
an analog-to-digital conversion unit configured to convert a pixel signal output from the sample-and-hold unit into a digital signal,
in which the sample-and-hold unit has two sample-and-hold circuits in parallel for one vertical signal line, and
at least one of the two sample-and-hold circuits has at least two sampling capacitors.
[B-2] The electronic apparatus according to [B-1] described above,
in which the solid-state image sensor has a stacked structure including at least two semiconductor substrates of a first semiconductor substrate and a second semiconductor substrate arranged on top of each other,
the pixel array section is formed on the first semiconductor substrate, and
the sample-and-hold unit is formed on a semiconductor substrate other than the first semiconductor substrate.

[B-3] The electronic apparatus according to [B-1] or [B-2] described above,
in which at least one of the two sample-and-hold circuits has a first switch unit configured to selectively short-circuit between input ends of the sampling capacitor.

[B-4] The electronic apparatus according to [B-3] described above,
in which each of at least two of the sampling capacitors includes combination of a plurality of unit capacitors.

[B-5] The electronic apparatus according to [B-4] described above,
in which at least one of the two sample-and-hold circuits has a second switch unit including a group of switches configured to selectively short-circuit between the vertical signal line and each input end of the plurality of unit capacitors by an independent control signal, and
the first switch unit includes a group of switches configured to selectively short-circuit between the input ends of the unit capacitors adjacent to each other.

[B-6] The electronic apparatus according to any one of [B-3] to [B-5] described above,
in which the pixel signal includes a reset signal output from the unit pixel upon being reset and a data signal output from the unit pixel upon being photo-electrically converted, and
one of the two sample-and-hold circuits has a sampling capacitor configured to sample the reset signal and a sampling capacitor configured to sample the data signal.

[B-7] The electronic apparatus according to [B-6] described above,
in which a capacitor ratio between the sampling capacitor configured to sample the reset signal and the sampling capacitor configured to sample the data signal is controllable by switching each switch of a group of switches of a second switch unit.

[B-8] The electronic apparatus according to any one of [B-1] to [B-7] described above,
in which the two sample-and-hold circuits have identical circuit configuration.

[B-9] The electronic apparatus according to any one of [B-1] to [B-8] described above,
in which the analog-to-digital conversion unit includes a single-slope analog-to-digital converter.

[B-10] The electronic apparatus according to any one of [B-1] to [B-8] described above,
in which the analog-to-digital conversion unit includes a delta-sigma analog-to-digital converter.

REFERENCE SIGNS LIST

1 CMOS image sensor (solid-state image sensor)
2 Unit pixel
11 Pixel array section
12 Row selection unit
13 Load MOS unit
14 Sample-and-hold unit
15 Analog-to-digital conversion unit
16 Storage unit
17 Data processing unit
18 Output unit
19 Timing control unit
21 Photodiode (photoelectric conversion unit)
22 Transfer transistor
23 Reset transistor
24 Amplification transistor
25 Selection transistor
31 ($31_1$ to $31_m$) Pixel drive line
32 ($32_1$ to $32_n$) Vertical signal line
141 Data signal sample-and-hold circuit
142 Reset signal sample-and-hold circuit
151 Analog-to-digital converter
152 Reference voltage generator
153 Delta-sigma analog-to-digital converter

The invention claimed is:

1. A solid-state image sensor comprising:
a pixel array including a plurality of pixels each having a photoelectric converter, the plurality of pixels being arranged in a matrix;
a sample-and-hold unit configured to sample and hold a pixel signal output from at least one of the pixels through a vertical signal line provided in association with column arrangement of the pixel array section; and
an analog-to-digital converter configured to convert a pixel signal output from the sample-and-hold unit into a digital signal,
wherein the sample-and-hold unit includes first and second sample-and-hold circuits connected in parallel and connected to the vertical signal line,
the first sample-and-hold circuit includes a first sampling capacitor and the second sample-and-hold circuit includes a second sampling capacitor and a third sampling capacitor, and
the second sample-and-hold circuit includes a group of switches configured to selectively connect the vertical signal line and respective input ends of the second and third sampling capacitors.

2. The solid-state image sensor according to claim 1,
wherein the solid-state image sensor has a stacked structure including at least two semiconductor substrates of a first semiconductor substrate and a second semiconductor substrate arranged on top of each other,
the pixel array is formed on the first semiconductor substrate, and
the sample-and-hold unit is formed on a semiconductor substrate other than the first semiconductor substrate.

3. The solid-state image sensor according to claim 1,
wherein the group of switches includes a first switch and a second switch, the first switch connecting the vertical signal line to the input end of the second sampling capacitor according to a first independent control signal, the second switch connecting the vertical signal line to the input end of the third sampling capacitor according to a second independent control signal.

4. The solid-state image sensor according to claim 1,
wherein the first and second sample-and-hold circuits have an identical circuit configuration.

5. The solid-state image sensor according to claim 1,
wherein the analog-to-digital converter includes a single-slope analog-to-digital converter.

6. The solid-state image sensor according to claim 1,
wherein the analog-to-digital converter includes a delta-sigma analog-to-digital converter.

7. A solid-state image sensor comprising:
a pixel array including a plurality of pixels each having a photoelectric converter, the plurality of pixels being arranged in a matrix;
a sample-and-hold unit configured to sample and hold a pixel signal output from at least one of the pixels through a vertical signal line provided in association with column arrangement of the pixel array section; and an analog-to-digital converter configured to convert a pixel signal output from the sample-and-hold unit into a digital signal, wherein the sample-and-hold unit includes first and second sample-and-hold circuits connected in parallel and connected to the vertical signal line, the first sample-and-hold circuit includes a first sampling capacitor and the second sample-and-hold circuit includes a second sampling capacitor and a third sampling capacitor having respective input ends that are configured to connect to the vertical signal line, and the second sample-and-hold circuits includes a first switch configured to selectively short-circuit the respective input ends of the second sampling capacitor and the third sampling capacitor.

8. The solid-state image sensor according to claim 7, wherein each of the sampling capacitors includes combination of a plurality of unit capacitors.

9. The solid-state image sensor according to claim 7, wherein the pixel signal includes a reset signal output from the pixel upon being reset and a data signal output from the pixel upon being photo-electrically converted, and the second sampling capacitor of the second sample and hold circuit is configured to hold the reset signal and the third sampling capacitor of the second sample and hold circuit is configured to sample the data signal.

10. The solid-state image sensor according to claim 9, wherein a capacitor ratio between the second sampling capacitor and the third sampling capacitor is controllable by a group of switches.

11. An electronic apparatus comprising a solid-state image sensor according to claim 7.

12. The electronic apparatus according to claim 11, wherein each of the sampling capacitors includes combination of a plurality of unit capacitors.

13. The electronic apparatus according to claim 11, wherein the pixel signal includes a reset signal output from the pixel upon being reset and a data signal output from the pixel upon being photo-electrically converted, and the second sampling capacitor of the second sample and hold circuit is configured to hold the reset signal and the third sampling capacitor of the second sample and hold circuit is configured to sample the data signal.

14. The electronic apparatus according to claim 13, wherein a capacitor ratio between the second sampling capacitor and the third sampling capacitor is controllable by a group of switches.

15. An electronic apparatus comprising a solid-state image sensor including
a pixel array including a plurality of pixels each having a photoelectric converter, the plurality of pixels being arranged in a matrix;
a sample-and-hold unit configured to sample and hold a pixel signal output from at least one of the pixels through a vertical signal line provided in association with column arrangement of the pixel array section; and
an analog-to-digital converter configured to convert a pixel signal output from the sample-and-hold unit into a digital signal,
wherein the sample-and-hold unit includes first and second sample-and-hold circuits connected in parallel and connected to the vertical signal line,
the first sample-and-hold circuit includes a first sampling capacitor and the second sample-and-hold circuit includes a second sampling capacitor and a third sampling capacitor, and
the second sample-and-hold circuit includes a group of switches configured to selectively connect the vertical signal line and respective input ends of the second and third sampling capacitors.

16. The electronic apparatus according to claim 15, wherein the solid-state image sensor has a stacked structure including at least two semiconductor substrates of a first semiconductor substrate and a second semiconductor substrate arranged on top of each other, the pixel array is formed on the first semiconductor substrate, and the sample-and-hold unit is formed on a semiconductor substrate other than the first semiconductor substrate.

17. The electronic apparatus according to claim 15, wherein the group of switches includes a first switch and a second switch, the first switch connecting the vertical signal line to the input end of the second sampling capacitor according to a first independent control signal, the second switch connecting the vertical signal line to the input end of the third sampling capacitor according to a second independent control signal.

18. The electronic apparatus according to claim 15, wherein the first and second sample-and-hold circuits have an identical circuit configuration.

19. The electronic apparatus according to claim 15, wherein the analog-to-digital converter includes a single-slope analog-to-digital converter.

20. The electronic apparatus according to claim 15, wherein the analog-to-digital converter includes a delta-sigma analog-to-digital converter.

* * * * *